US012782518B2

(12) United States Patent
Ohkawa et al.

(10) Patent No.: US 12,782,518 B2
(45) Date of Patent: Nov. 3, 2026

(54) DISTANCE MEASUREMENT SYSTEM AND PHOTODETECTION DEVICE

(71) Applicant: Sony Semiconductor Solutions Corporation, Kanagawa (JP)

(72) Inventors: Takeshi Ohkawa, Kanagawa (JP); Akito Sekiya, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 884 days.

(21) Appl. No.: 18/044,526

(22) PCT Filed: Aug. 16, 2021

(86) PCT No.: PCT/JP2021/029939
§ 371 (c)(1),
(2) Date: Mar. 8, 2023

(87) PCT Pub. No.: WO2022/059397
PCT Pub. Date: Mar. 24, 2022

(65) Prior Publication Data

US 2023/0324518 A1 Oct. 12, 2023

(30) Foreign Application Priority Data

Sep. 15, 2020 (JP) ................................ 2020-154753

(51) Int. Cl.
*G01S 7/481* (2006.01)
*G01R 19/00* (2006.01)
*G01S 17/08* (2006.01)

(52) U.S. Cl.
CPC ........ *G01S 7/4816* (2013.01); *G01R 19/0092* (2013.01); *G01S 17/08* (2013.01)

(58) Field of Classification Search
CPC .... G01S 7/4863; G01S 7/4816; G01S 17/931; G01S 17/10; G01S 7/4861; G01S 7/4868;
(Continued)

(56) References Cited

U.S. PATENT DOCUMENTS 7,787,131 B1 * 8/2010 Moran ............... G01B 9/02098 356/520
9,453,914 B2 * 9/2016 Stettner ................... G01S 17/18
(Continued)

FOREIGN PATENT DOCUMENTS

JP 850026233 B1 8/1975
JP H0471187 U 6/1992
(Continued)

OTHER PUBLICATIONS

International Search Report (PCT/ISA/210), International Application No. PCT/JP2021/029939, dated Oct. 26, 2021.

*Primary Examiner* — Helal A Algahaim
*Assistant Examiner* — James W. Napier
(74) *Attorney, Agent, or Firm* — Michael Best & Friedrich LLP

(57) ABSTRACT

Distance measurement systems and devices that optimize avalanche photodiode bias voltage are disclosed. In one example, a distance measurement system a light emitting device that emits distance measurement light, and a photodetection device that receives reflected light of the distance measurement light. The photodetection device includes a pixel array with a plurality of pixels that respectively include avalanche photodiodes that detect the reflected light; a current measurement circuit that measures a total pixel current of the pixel array; and bias voltage control that controls avalanche photodiode bias voltage using a detection result of the current measurement circuit. The light emitting device also includes light emission control circuitry that controls a light quantity of the distance measurement light using the detection result of the current measurement circuit.

18 Claims, 17 Drawing Sheets

(58) Field of Classification Search
CPC ...... G01S 7/4913; G01S 17/08; H10F 39/803; H10F 39/107; G01R 19/0092
See application file for complete search history.

(56) References Cited

U.S. PATENT DOCUMENTS

| | | | | |
|---|---|---|---|---|
| 9,575,184 | B2 * | 2/2017 | Gilliland | G01S 17/10 |
| 2009/0039869 | A1 * | 2/2009 | Williams | G01R 1/203<br>324/123 R |
| 2012/0080583 | A1 | 4/2012 | Johnson | |
| 2017/0179173 | A1 | 6/2017 | Mandai | |
| 2019/0094361 | A1 | 3/2019 | Onal | |
| 2019/0310354 | A1 | 10/2019 | Li | |
| 2020/0212854 | A1 * | 7/2020 | Seyed Aliroteh | G01S 17/10 |
| 2020/0284883 | A1 * | 9/2020 | Ferreira | G01S 7/497 |

FOREIGN PATENT DOCUMENTS

| | | | |
|---|---|---|---|
| JP | H08201519 | A | 8/1996 |
| JP | 2010008088 | A | 1/2010 |
| JP | 2019191126 | A | 10/2019 |
| JP | 2020048019 | A | 3/2020 |
| TW | 202025714 | A | 7/2020 |
| WO | 2019004144 | A1 | 1/2019 |

* cited by examiner

DISTANCE MEASUREMENT SYSTEM AND PHOTODETECTION DEVICE

TECHNICAL FIELD

The present disclosure relates to a distance measurement system and a photodetection device.

BACKGROUND ART

A distance measurement system using a plurality of avalanche photodiodes represented by an avalanche photodiode (APD), a single photon avalanche diode (SPAD), or the like is known. This distance measurement system includes a pixel array including a plurality of pixels having avalanche photodiodes. The pixel array includes active pixels set to react to incident light and inactive pixels set not to react to incident light.

In the pixel array, the number of inactive pixels is dominant. Therefore, a technique for adjusting a bias voltage to be supplied to each avalanche photodiode on the basis of a result of measuring a leakage current flowing through an inactive pixel has been proposed.

CITATION LIST

Patent Document

Patent Document 1: Japanese Patent Application Laid-Open No. 2020-048019

SUMMARY OF THE INVENTION

Problems to be Solved by the Invention

For example, a photodiode may react to light in a short distance or in an environment where background light is large. In this case, it is presumed that the total current of the entire pixel array greatly deviates from the total leakage current, although the proportion of the active pixels is small. Therefore, when a bias voltage set on the basis of the measurement result of only the leakage current is used, a situation such as a decrease in distance measurement performance and an increase in power consumption may occur.

The present disclosure provides a distance measurement system and a photodetection device capable of optimizing a bias voltage to be supplied to an avalanche photodiode.

Solutions to Problems

A distance measurement system according to one embodiment of the present disclosure includes a light emitting device that emits distance measurement light, and a photodetection device that receives reflected light of the distance measurement light. The photodetection device includes: a pixel array in which a plurality of pixels is arrayed, the plurality of pixels respectively including a plurality of avalanche photodiodes that detects the reflected light; a current measurement circuit that measures a total pixel current of the pixel array; and a bias voltage control unit that controls a bias voltage to be supplied to the plurality of avalanche photodiodes using a detection result of the current measurement circuit. The light emitting device includes a light emission control unit that controls a light quantity of the distance measurement light using the detection result of the current measurement circuit.

The current measurement circuit may include:

a resistance element connected in series to the plurality of avalanche photodiodes;

a first operational amplifier that outputs a voltage of the resistance element; and a low-pass filter that smooths an output value of the first operational amplifier, the bias voltage control unit may include a second operational amplifier that adjusts the bias voltage according to a difference between an average pixel current value obtained by smoothing by the low-pass filter and a preset first target value, and the light emission control unit may include a third operational amplifier that adjusts the light quantity according to a difference between the average pixel current value and a preset second target value.

The current measurement circuit may include:

a resistance element connected in series to the plurality of avalanche photodiodes;

a first operational amplifier that outputs a voltage of the resistance element;

an integration circuit that integrates an output value of the first operational amplifier; and a holding circuit that temporarily holds an integrated value of the integration circuit, the bias voltage control unit may include a second operational amplifier that adjusts the bias voltage according to a difference between a held value held by the holding circuit and a preset first target voltage, and the light emission control unit may include a third operational amplifier that adjusts the light quantity according to a difference between the held value and a preset second target value.

The photodetection device may further include a constant-voltage source connected to the plurality of avalanche photodiodes, the current measurement circuit may include a resistance element connected to the plurality of avalanche photodiodes via the constant-voltage source, and a first operational amplifier that outputs a voltage of the resistance element, the bias voltage control unit may include an integration circuit that integrates an output value of the first operational amplifier, a holding circuit that temporarily holds an integrated value of the integration circuit, and a second operational amplifier that adjusts the bias voltage and the constant-voltage source according to a difference between the held value held by the holding circuit and a preset first target voltage, and the light emission control unit may include a third operational amplifier that adjusts the light quantity according to a difference between the held value and a preset second target value.

The constant-voltage source may include:

a current mirror circuit including a first transistor connected in series to the plurality of avalanche photodiodes and a second transistor connected in series to the resistance element; and a fourth operational amplifier that controls the first transistor and the second transistor according to a difference between the total pixel current and an output value of the second operational amplifier.

The photodetection device may further include:

a plurality of switch elements that switches the plurality of pixels to active pixels or inactive pixels;

an inactive pixel current measurement circuit that measures an inactive pixel current indicating a sum of pixel currents of the inactive pixels; and an active pixel current measurement circuit that measures an active pixel current indicating a sum of pixel currents of the active pixels by subtracting a detection value of the inactive pixel current measurement circuit from a detection value of the current measurement circuit.

The active pixel current measurement circuit may include a first sample and hold circuit that temporarily holds a first detection value detected by the active pixel current measurement circuit before the distance measurement light is emitted, and a second sample and hold circuit that temporarily holds a second detection value detected by the active pixel current measurement circuit after the distance measurement light is emitted, and the light emission control unit may include a first operational amplifier that outputs a difference between the first detection value and the second detection value, and a second operational amplifier that adjusts the light quantity according to a difference between an output value of the first operational amplifier and a preset target value.

The plurality of avalanche photodiodes may be provided on a first semiconductor substrate, and a part of the photodetection device excluding the plurality of avalanche photodiodes may be provided on a second semiconductor substrate to be bonded to the first semiconductor substrate.

The plurality of avalanche photodiodes may be provided on a first semiconductor substrate, and a whole of the photodetection device excluding the plurality of avalanche photodiodes may be provided on a second semiconductor substrate to be bonded to the first semiconductor substrate.

The current measurement circuit may be connected to an anode of each of the plurality of avalanche photodiodes.

The current measurement circuit may be connected to a cathode of each of the plurality of avalanche photodiodes.

A photodetection device according to one embodiment of the present disclosure includes: a pixel array in which a plurality of pixels is arrayed, the plurality of pixels respectively including a plurality of avalanche photodiodes that detects reflected light of distance measurement light; a current measurement circuit that measures a total pixel current of the pixel array; and a bias voltage control unit that controls a bias voltage to be supplied to the plurality of avalanche photodiodes using a detection result of the current measurement circuit.

The current measurement circuit may include:

a resistance element connected in series to the plurality of avalanche photodiodes;

a first operational amplifier that outputs a voltage of the resistance element; and a low-pass filter that smooths an output value of the first operational amplifier, and the bias voltage control unit may include a second operational amplifier that adjusts the bias voltage according to a difference between an average pixel current value obtained by smoothing by the low-pass filter and a preset first target value.

The current measurement circuit may include:

a resistance element connected in series to the plurality of avalanche photodiodes;

a first operational amplifier that outputs a voltage of the resistance element;

an integration circuit that integrates an output value of the first operational amplifier; and a holding circuit that temporarily holds an integrated value of the integration circuit, and the bias voltage control unit may include a second operational amplifier that adjusts the bias voltage according to a difference between a held value held by the holding circuit and a preset first target voltage.

The photodetection device may further include a constant-voltage source connected to the plurality of avalanche photodiodes, in which the current measurement circuit may include a resistance element connected to the plurality of avalanche photodiodes via the constant-voltage source, and a first operational amplifier that outputs a voltage of the resistance element, and the bias voltage control unit may include an integration circuit that integrates an output value of the first operational amplifier, a holding circuit that temporarily holds an integrated value of the integration circuit, and a second operational amplifier that adjusts the bias voltage and the constant-voltage source according to a difference between a held value held by the holding circuit and a preset first target voltage.

The constant-voltage source may include:

a current mirror circuit including a first transistor connected in series to the plurality of avalanche photodiodes and a second transistor connected in series to the resistance element; and a third operational amplifier that controls the first transistor and the second transistor according to a difference between the total pixel current and an output value of the second operational amplifier.

The photodetection device may further include:

a plurality of switch elements that switches the plurality of pixels to active pixels or inactive pixels;

an inactive pixel current measurement circuit that measures an inactive pixel current indicating a sum of pixel currents of the inactive pixels; and an active pixel current measurement circuit that measures an active pixel current indicating a sum of pixel currents of the active pixels by subtracting a detection value of the inactive pixel current measurement circuit from a detection value of the current measurement circuit.

The active pixel current measurement circuit may include a first sample and hold circuit that temporarily holds a first detection value detected by the active pixel current measurement circuit before the distance measurement light is emitted, and a second sample and hold circuit that temporarily holds a second detection value detected by the active pixel current measurement circuit after the distance measurement light is emitted.

The plurality of avalanche photodiodes may be provided on a first semiconductor substrate, and a part of the photodetection device excluding the plurality of avalanche photodiodes may be provided on a second semiconductor substrate to be bonded to the first semiconductor substrate.

The plurality of avalanche photodiodes may be provided on a first semiconductor substrate, and a whole of the photodetection device excluding the plurality of avalanche photodiodes may be provided on a second semiconductor substrate to be bonded to the first semiconductor substrate.

MODE FOR CARRYING OUT THE INVENTION

First Embodiment

Figure 1:
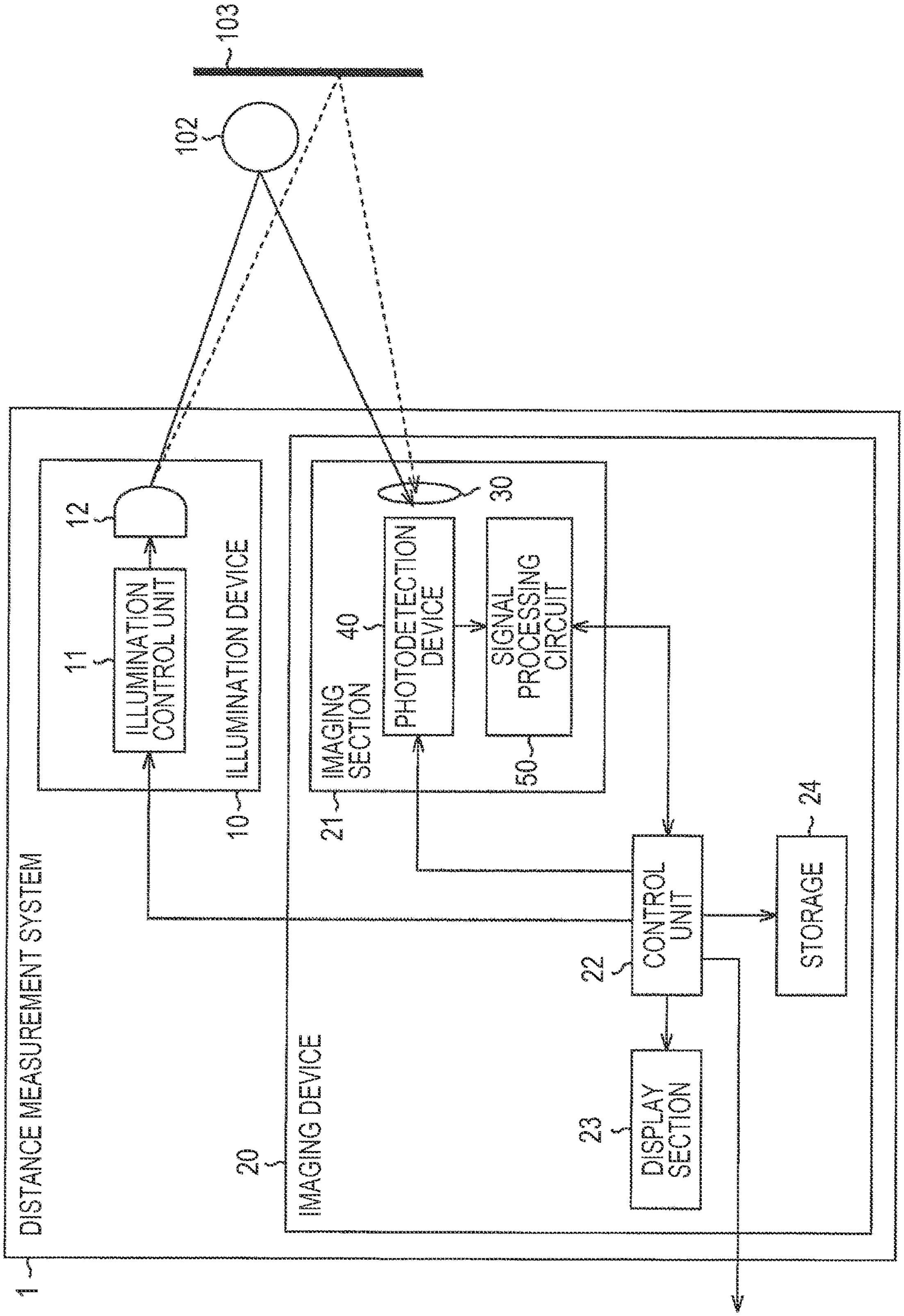
FIG. 1 is a block diagram illustrating a configuration example of a distance measurement system according to a first embodiment.

FIG. 1 is a block diagram illustrating a configuration example of a distance measurement system according to a first embodiment. A distance measurement system 1 illustrated in FIG. 1 is a system that captures a distance image using a time of flight (ToF) method, and includes a light emitting device 10 and an imaging device 20.

The light emitting device 10 includes a light emission control unit 11 and a light emitting element 12. The light emission control unit 11 controls a pattern of distance measurement light emitted from the light emitting element 12 on the basis of the control of a control unit 22. Specifically, the light emission control unit 11 controls a pattern of the distance measurement light emitted from the light emitting element 12 according to an irradiation code included in an irradiation signal supplied from the control unit 22. For example, the irradiation code includes two values which are "1" (High) and "0" (Low). The light emission control unit 11 turns on the light emitting element 12 when the value of the irradiation code is "1", and turns off the light emitting element 12 when the value of the irradiation code is "0".

The light emitting element 12 emits distance measurement light in a predetermined wavelength region on the basis of the control of the light emission control unit 11. The light emitting element 12 is, for example, an infrared laser diode. The type of the light emitting element 12 and the wavelength range of the distance measurement light can be freely set according to use applications of the distance measurement system 1 or the like.

The imaging device 20 receives reflected light obtained by reflecting the distance measurement light by a subject 102 and a subject 103. The imaging device 20 includes an imaging section 21, the control unit 22, a display section 23, and a storage 24.

The imaging section 21 includes a lens 30, a photodetection device 40, and a signal processing circuit 50. The lens 30 forms an image of the incident light on the photodetection device 40. Note that any configuration can be used as the configuration of the lens 30, and for example, the lens 30 can be constituted by a plurality of lens groups.

The photodetection device 40 images the subject 102, the subject 103, and the like on the basis of the control of the control unit 22. In addition, the photodetection device 40 outputs a signal obtained by the imaging to the signal processing circuit 50.

The signal processing circuit 50 processes the output signal of the photodetection device 40 on the basis of the control of the control unit 22. For example, the signal processing circuit 50 detects the distance to the subject on the basis of the output signal of the photodetection device 40 and generates a distance image indicating the distance to the subject.

The control unit 22 includes, for example, a control circuit, a processor, or the like such as a field programmable gate array (FPGA) or a digital signal processor (DSP). The control unit 22 controls the light emission control unit 11, the photodetection device 40, and the signal processing circuit 50.

The display section 23 includes, for example, a panel type display device such as a liquid crystal display device or an organic electro luminescence (EL) display device.

The storage 24 can be constituted by any storage devices, storage mediums, or the like, and stores a distance image or the like.

Figure 2:
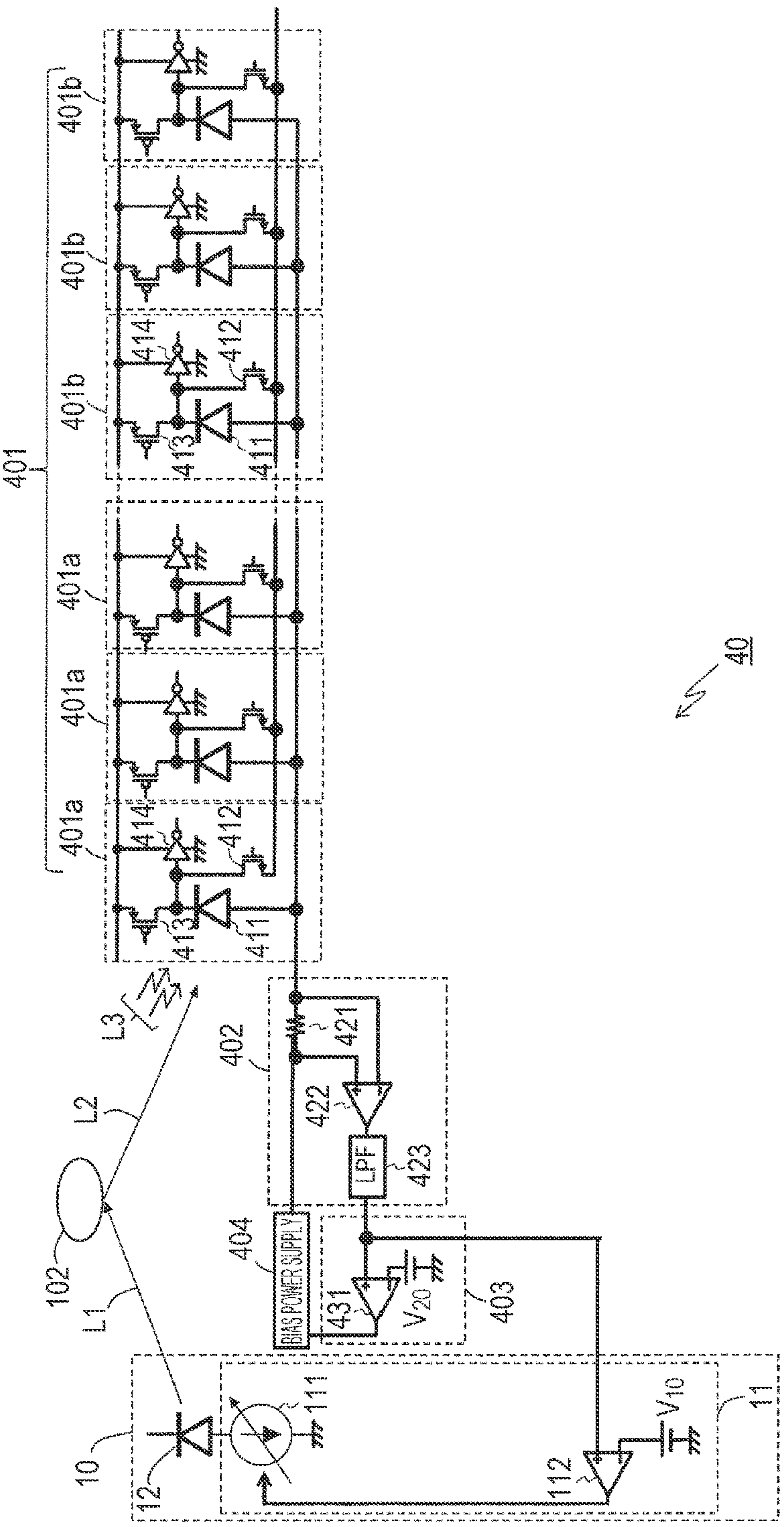
FIG. 2 is a diagram illustrating a circuit configuration of a light emitting device and a photodetection device according to the first embodiment.

FIG. 2 is a diagram illustrating a circuit configuration of the light emitting device 10 and the photodetection device 40 according to the first embodiment.

First, a circuit configuration of the light emitting device 10 will be described. In the light emitting device 10, the light emission control unit 11 is connected in series to the light emitting element 12. The light emitting element 12 irradiates the subject 102 with distance measurement light L1. At this time, a light quantity of the distance measurement light L1 is controlled by the light emission control unit 11.

The light emission control unit 11 includes a variable current source 111 and an operational amplifier 112. The variable current source 111 supplies a direct light emission current to the light emitting element 12. The light emission current corresponds to the light quantity of the distance measurement light L1 and is adjusted by the operational amplifier 112. A signal indicating an average pixel current value obtained from a low-pass filter (LPF) 423 to be described later is input to the non-inverting input terminal (+) of the operational amplifier 112. The potential of the inverting input terminal (−) is set to a target value $V_{10}$.

The operational amplifier 112 adjusts the light emission current of the variable current source 111 according to a difference between the signal value (average pixel current value) and the target value $V_{10}$. For example, in a case where the signal value (average pixel current value) is larger than the target value $V_{10}$, the light emission current supplied from the variable current source 111 increases. Conversely, in a case where the signal value (average pixel current value) is smaller than the target value $V_{10}$, the light emission current decreases.

Next, a circuit configuration of the photodetection device 40 will be described. The photodetection device 40 includes a pixel array 401, a current measurement circuit 402, a bias voltage control unit 403, and a bias power supply 404.

The pixel array 401 includes a plurality of pixels 401*a* and a plurality of pixels 401*b* arranged two-dimensionally. Each of the pixels 401*a* and pixels 401*b* includes a photodetection element 411, a switch element 412, a current source 413, and an inverter 414.

The photodetection element 411 is an avalanche photodiode represented by APD, SPAD, or the like. A cathode of the photodetection element 411 is connected to the current source 413 and the inverter 414. An anode of the photodetection element 411 is connected to the current measurement circuit 402.

The switch element 412 includes an N-type MOS transistor that switches the corresponding pixel to an active pixel or an inactive pixel. A control signal is input from the control unit 22 to the gate of the switch element 412. When the switch element 412 is turned off on the basis of the control signal, the corresponding pixel is switched to an active pixel in which the photodetection element 411 reacts to reflected light L2. On the contrary, when the switch element 412 is turned on on the basis of the control signal, the corresponding pixel is switched to an inactive pixel in which the photodetection element 411 does not react to the reflected light L2. In the present embodiment, the pixel 401*a* is set as an active pixel, and the pixel 401*b* is set as an inactive pixel.

In the present embodiment, when the distance measurement system 1 operates normally, the number of active pixels is smaller than the number of inactive pixels.

The current source 413 includes a P-type MOS transistor that supplies a variable voltage to the cathode of the photodetection element 411. When a reverse voltage equal to or higher than the breakdown voltage is applied between the anode and the cathode of the photodetection element 411 by the current source 413, the photodetection element 411 is set to a Geiger mode. When photons enter the photodetection element 411 set to the Geiger mode, avalanche multiplication occurs, and a current flows through the photodetection element 411. This current is input to the inverter 414.

The inverter 414 compares the voltage of the input terminal, in other words, the cathode voltage of the photodetection element 411 with a reference voltage. In addition, the inverter 414 outputs a signal indicating whether the cathode voltage is higher or lower than the reference voltage from the output terminal to the signal processing circuit 50. The signal processing circuit 50 can detect a voltage change of the cathode voltage by this signal.

The current measurement circuit 402 includes a resistance element 421, an operational amplifier 422, and an LPF 423. The resistance element 421 is connected in series to all the photodetection elements 411 provided in the pixels 401*a* and the pixels 401*b*. The non-inverting input terminal (+) of the operational amplifier 422 is connected to one end of the resistance element 421, and the inverting input terminal (−) is connected to the other end of the resistance element 421. The operational amplifier 422 outputs a voltage across the resistance element 421 from the output terminal to the bias voltage control unit 403. The output value of the operational amplifier 422 corresponds to the total pixel current of the pixel array 401. The LPF 423 smooths the output value of the operational amplifier 422. Thus, an average pixel current value corresponding to the average of the total pixel current of the pixel array 401 is obtained.

Note that, although the current measurement circuit 402 includes an analog circuit in the present embodiment, a part of the current measurement circuit 402 may include a digital circuit. Specifically, the current measurement circuit 402 includes an ADC (analog-digital converter), a digital LPF, and a DAC (digital-analog converter). The ADC converts an analog signal output from the operational amplifier 422 into a digital signal. The digital LPF performs smoothing processing on the digital signal. The DAC converts the smoothed digital signal into an analog signal.

In the present embodiment, the average pixel current value obtained by the smoothing processing performed by the LPF 423 is also input to the non-inverting input terminal (+) of the operational amplifier 112 of the light emission control unit 11. The operational amplifier 112 adjusts the light emission current supplied from the variable current source 111 to the light emitting element 12 such that the average pixel current value coincides with the target value V10.

The bias voltage control unit 403 includes an operational amplifier 431. The average pixel current value is input to the non-inverting input terminal (+) of the operational amplifier 431. The potential of the inverting input terminal (−) of the operational amplifier 431 is set to a target value $V_{20}$. The operational amplifier 431 controls the bias power supply 404 so that the average pixel current value coincides with the target value $V_{20}$. That is, the operational amplifier 431 adjusts the bias voltage supplied from the bias power supply 404 to the anode of each photodetection element 411 according to a difference between the average pixel current value and the target value $V_{20}$.

Figure 3:
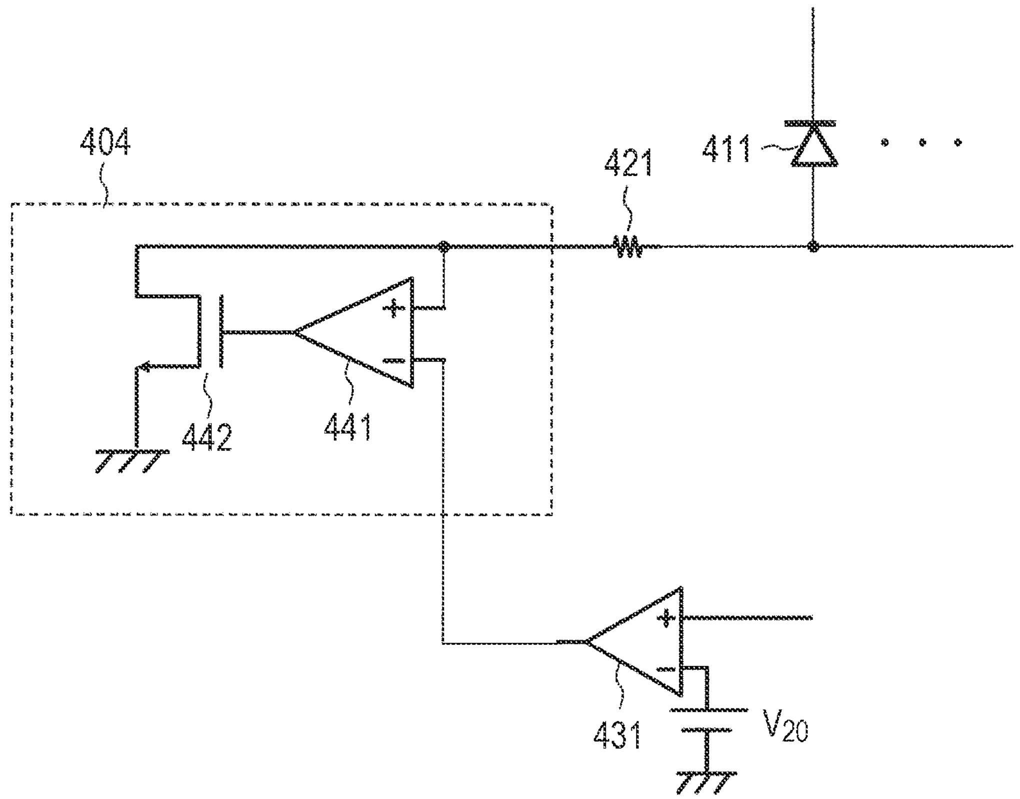
FIG. 3 is a circuit diagram illustrating a configuration of a bias power supply.

FIG. 3 is a circuit diagram illustrating a configuration of the bias power supply 404. The bias power supply 404 includes an operational amplifier 441 and a current source 442. The non-inverting input terminal (+) of the operational amplifier 441 is connected to the anode of each photodetection element 411 via the resistance element 421. On the other hand, the inverting input terminal (−) is connected to the output terminal of the operational amplifier 431 described above. The current source 442 includes an N-type MOS transistor. The gate of the N-type MOS transistor is connected to an output terminal of the operational amplifier 441. The drain is connected to the non-inverting input terminal (+) of the operational amplifier 441. The source is grounded. In the bias power supply 404, the operational amplifier 441 controls the gate potential of the N-type MOS transistor, thereby adjusting the bias voltage to be supplied to the anode of each photodetection element 411.

Figure 4:
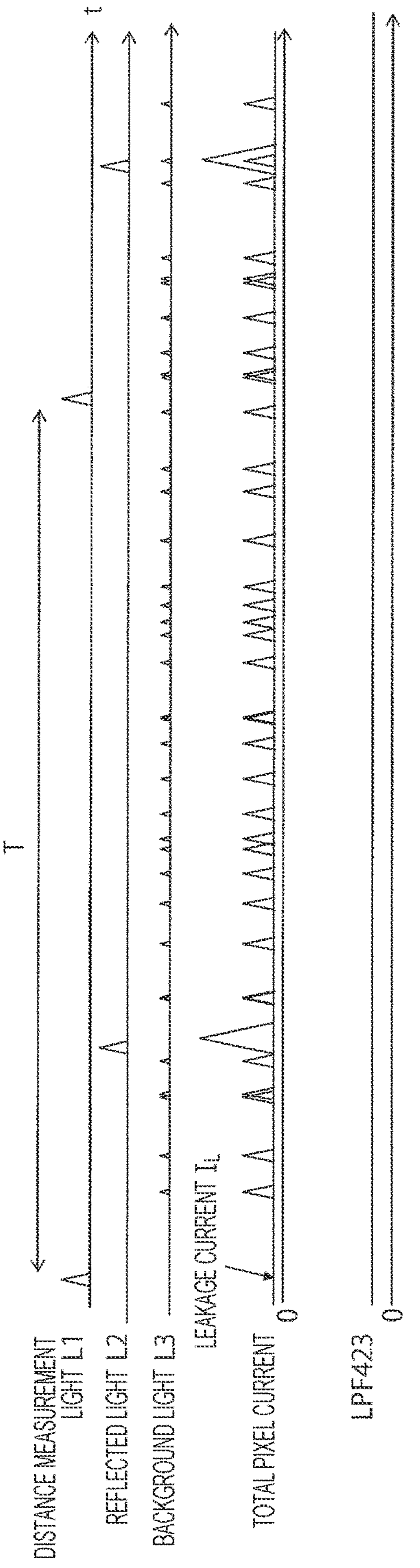
FIG. 4 is a timing chart illustrating operation timing of the distance measurement system according to the first embodiment.

FIG. 4 is a timing chart illustrating operation timing of the distance measurement system 1 according to the present embodiment. The operation of the distance measurement system 1 configured as described above will be described below with reference to FIG. 4.

Every time the light emitting element 12 emits light in a period T, the subject 102 is irradiated with the distance measurement light L1. Furthermore, the reflected light L2 is detected by the photodetection element 411 of each pixel 401*a*. The photodetection element 411 also detects background light L3 (see FIG. 2) in an installation environment of the subject 102. A light quantity of the background light L3 is smaller than the light quantity of the reflected light L2.

The total pixel current obtained by adding together the currents of all the pixels of the pixel array 401 measured by the current measurement circuit 402 includes a current component indicating the light quantity of the background light L3 and a current component obtained by adding the light quantity of the reflected light L2 to the light quantity of the background light L3. The total pixel current also includes a component of a leakage current $I_L$ of each pixel 401*b* (inactive pixel). The breakdown voltage of the photodetection element 411 fluctuates with a temperature change or varies among individuals. Therefore, in the inactive pixel (pixel 401*b*), the anode-cathode voltage of the photodetection element 411 does not drop to the breakdown voltage, and a leakage current may be generated in response to photons.

The total pixel current is smoothed by the LPF 423. With this processing, an average pixel current value is obtained. Thereafter, the bias voltage is adjusted by the operational amplifier 431 of the bias voltage control unit 403 so that the total pixel current becomes constant. For example, under an environment where the light quantity of the background light L3 is large, the total pixel current also increases. In this case, in the bias power supply 404, the operational amplifier 441 lowers the gate potential of the current source 442 (N-type MOS transistor). As a result, the bias voltage increases.

On the other hand, under an environment where the light quantity of the background light L3 is small, the total pixel current also decreases. In this case, in the bias power supply 404, the operational amplifier 441 raises the gate potential of the current source 442 (N-type MOS transistor). As a result, the bias voltage decreases.

Therefore, according to the present embodiment, the bias voltage is adjusted by measuring the pixel currents of both the active pixels (pixels 401*a*) and the inactive pixels (pixels 401*b*). Therefore, the bias voltage can be optimized according to the light quantity of the background light L3.

Furthermore, in the present embodiment, the light emission control unit 11 adjusts the light emission current on the basis of the average pixel current value obtained by the smoothing processing performed by the LPF 423. For example, under an environment where the light quantity of the background light L3 is large, the average pixel current value also increases. In this case, the operational amplifier 112 adjusts the variable current source 111 so as to increase the light emission current. As a result, the distance measurement performance can be maintained even in an environment where the light quantity of the background light L3 is large.

On the other hand, under an environment where the light quantity of the background light L3 is small, the average pixel current value also decreases. In this case, the operational amplifier 112 adjusts the variable current source 111 so as to decrease the light emission current. This makes it possible to reduce power consumption of the light emitting device 10 under an environment where the light quantity of the background light L3 is small.

Second Embodiment

Figure 5:
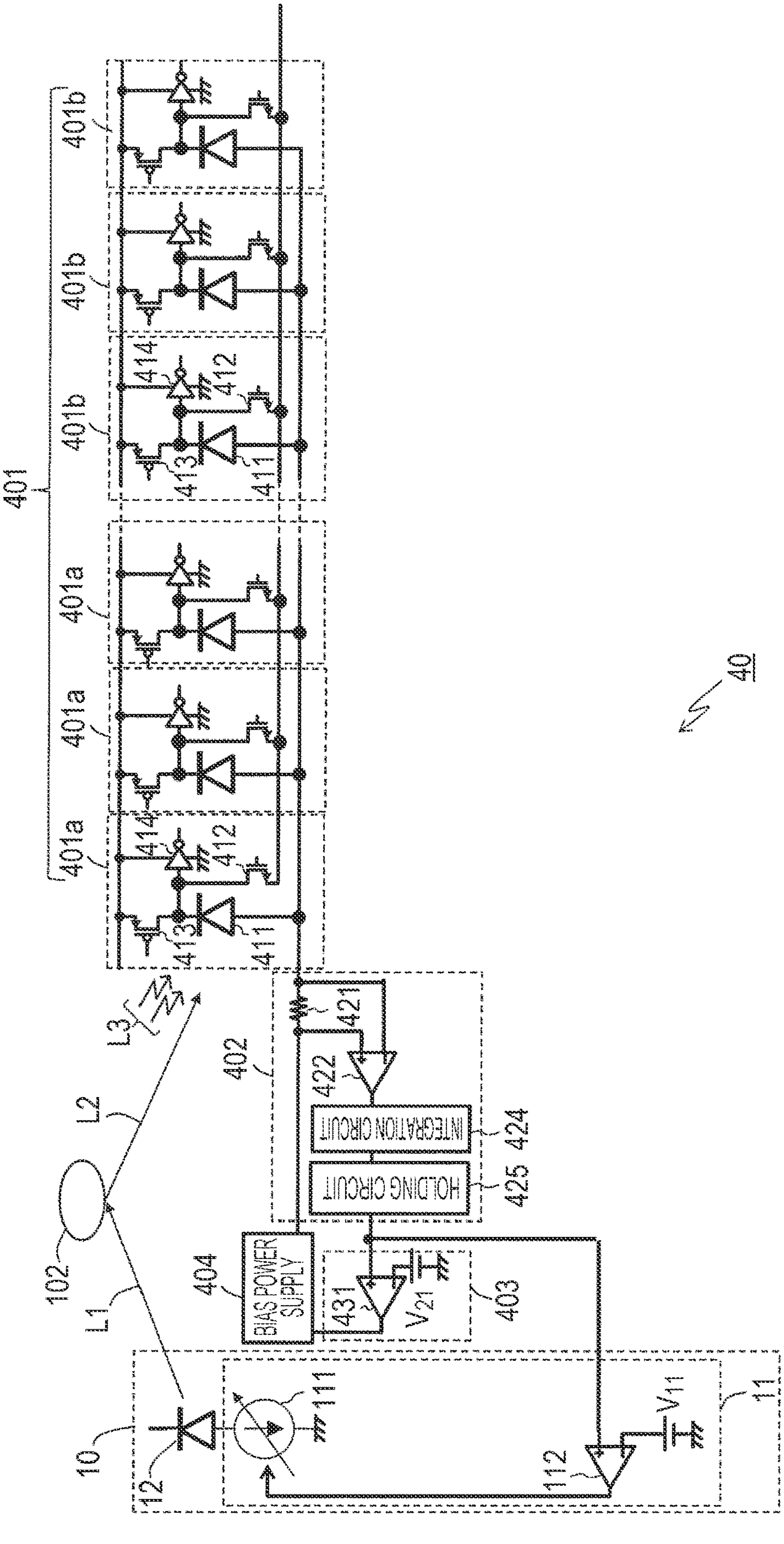
FIG. 5 is a diagram illustrating a circuit configuration of a light emitting device and a photodetection device according to a second embodiment.

FIG. 5 is a diagram illustrating a circuit configuration of a light emitting device 10 and a photodetection device 40 according to a second embodiment. Components similar to those of the first embodiment described above are denoted by the same reference numerals, and detailed description thereof will be omitted.

The present embodiment is different from the first embodiment in the configuration of a current measurement circuit 402. The current measurement circuit 402 according to the present embodiment includes an integration circuit 424 and a holding circuit 425 instead of the LPF 423.

The integration circuit 424 is connected to the output terminal of the operational amplifier 422 of the current measurement circuit 402. The integration circuit 424 integrates an output value of the operational amplifier 422, that is, total pixel current, and outputs the integrated value to the holding circuit 425. The holding circuit 425 temporarily holds the integrated value of the integration circuit 424, that is, an integrated value of the total pixel current.

Figure 6:
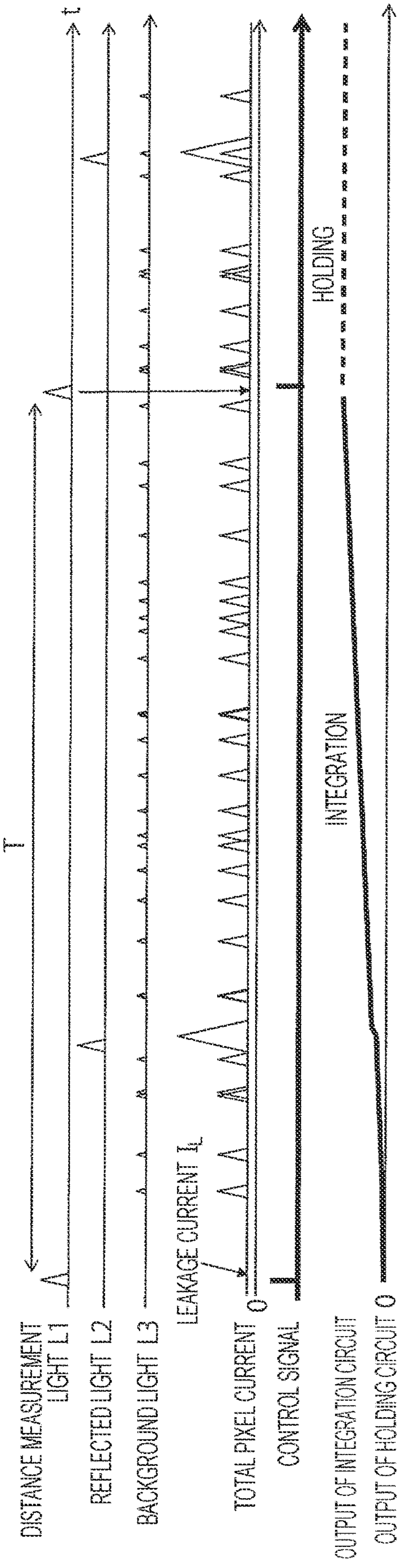
FIG. 6 is a timing chart illustrating operation timing of a distance measurement system according to the second embodiment.

FIG. 6 is a timing chart illustrating operation timing of the distance measurement system according to the present embodiment. The operation of the distance measurement system according to the present embodiment will be described below with reference to FIG. 6.

In the present embodiment, the photodetection element 411 of each pixel 401*a* also detects the reflected light L2 and the background light L3 each time the light emitting element 12 irradiates the subject 102 with the distance measurement light L1 in a period T as in the first embodiment. In addition, the total pixel current detected by the current measurement circuit 402 also includes a current component indicating a light quantity of the background light L3, a current component indicating a light quantity of the reflected light L2, and a component of the leakage current $I_L$ of each pixel 401*b* (inactive pixel).

The total pixel current is integrated by the integration circuit 424. The integration circuit 424 integrates the total pixel current on the basis of a control signal input from the control unit 22 in the same period T as the light emission period of the light emitting element 12. That is, the integral interval of the integration circuit 424 is set to the period T.

Subsequently, the integrated value of the integration circuit 424 is held by the holding circuit 425. The holding circuit 425 also holds the integrated value on the basis of the control signal. That is, the holding interval of the holding circuit 425 is set to the period T.

Thereafter, the operational amplifier 431 adjusts the bias voltage according to a difference between the integrated value and a target value $V_{21}$. Note that the target value $V_{21}$ is a value different from the target value $V_{20}$ described in the first embodiment. In this manner, the bias voltage is adjusted so that the total pixel current is constant.

Furthermore, in the present embodiment, the light emission control unit 11 adjusts the light emission current according to the difference between the integrated value of the pixel currents temporarily held in the holding circuit 425 and a target value $V_{11}$. Note that the target value $V_{11}$ is a value different from the target value $V_{10}$ described in the first embodiment. The light emission current is adjusted in this manner, so that the light quantity of the distance measurement light L1 is optimized according to the light quantity of the background light L3.

According to the present embodiment described above, the bias voltage is adjusted using the total pixel current of the pixel array 401, whereby photodetection performance can be optimized according to the light quantity of the background light L3. In addition, the light emission current is also adjusted using the total pixel current, whereby the light emission performance can also be optimized according to the light quantity of the background light L3.

Third Embodiment

Figure 7:
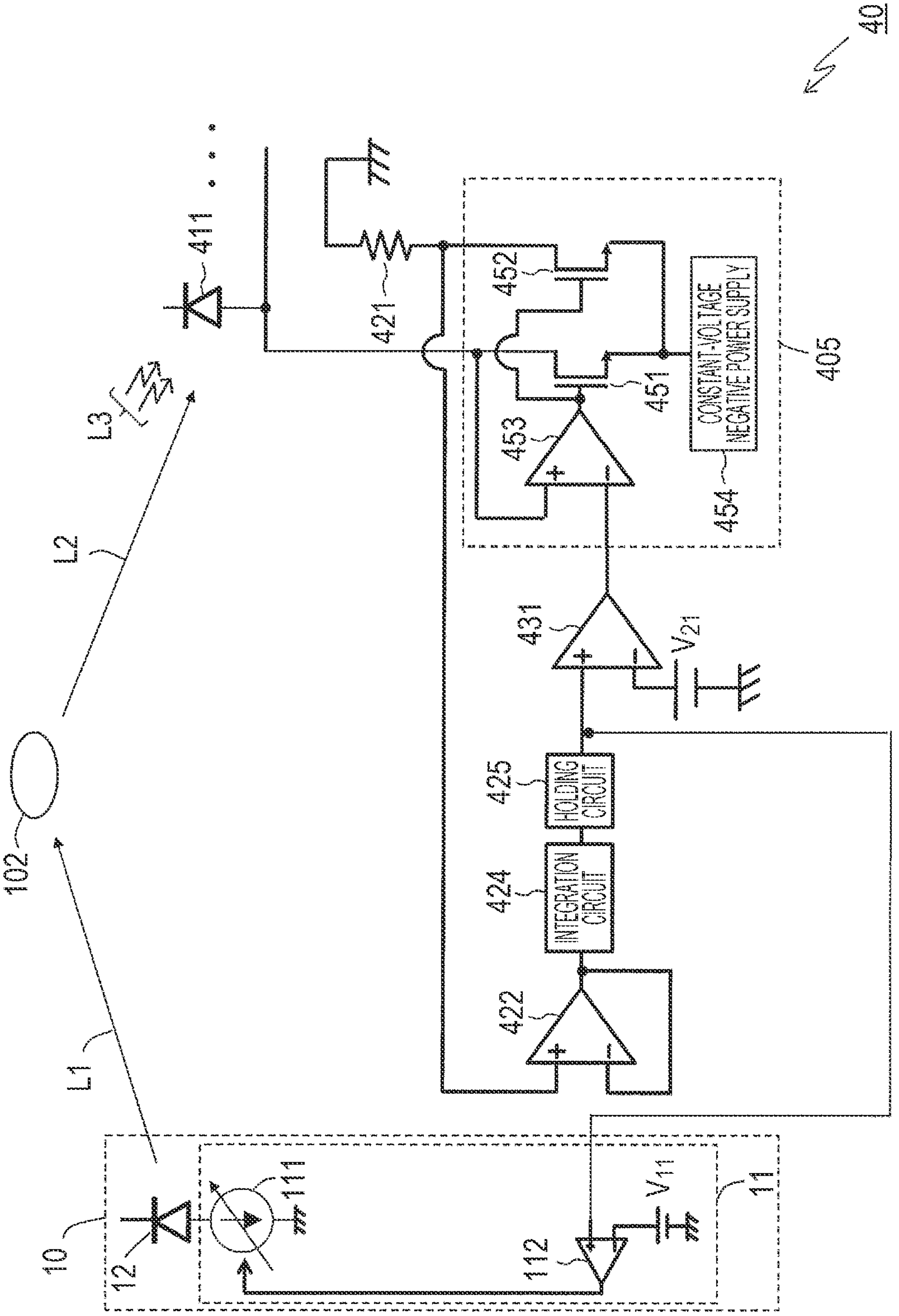
FIG. 7 is a diagram illustrating a part of a circuit configuration of a light emitting device and a photodetection device according to a third embodiment.

FIG. 7 is a diagram illustrating a part of a circuit configuration of a light emitting device 10 and a photodetection device 40 according to a third embodiment. Components similar to those of the first embodiment described above are denoted by the same reference numerals, and detailed description thereof will be omitted.

The photodetection device 40 according to the present embodiment further includes a constant-voltage source 405. The constant-voltage source 405 according to the present embodiment is a bias power supply having a current detection function, and includes a first transistor 451, a second transistor 452, an operational amplifier 453, and a constant-voltage negative power supply 454. The first transistor 451 and the second transistor 452 are N-type MOS transistors and constitute a current mirror circuit.

The drain of the first transistor 451 is connected to the anode of each of the photodetection elements 411, and the source is connected to the constant-voltage negative power supply 454. On the other hand, the drain of the second transistor 452 is connected in series to the resistance element 421 of the current measurement circuit 402, and the source is connected to the constant-voltage negative power supply 454. The gate of each transistor is connected to an output terminal of the operational amplifier 453.

The non-inverting input terminal (+) of the operational amplifier 453 is connected to the anode of each photodetection element 411, and the inverting input terminal (−) is connected to the output terminal of the operational amplifier 431 of the bias voltage control unit 403.

In the present embodiment, the total pixel current flows through the first transistors 451. At this time, the second transistor 452 forms a current mirror circuit with the first transistor 451, and thus, the same current as the total pixel current flows through the second transistor 452 and is detected by the resistance element 421. In addition, the operational amplifier 422 outputs a detection current of the resistance element 421.

Subsequently, the total pixel current is integrated by the integration circuit 424, and the integrated value is temporarily held in the holding circuit 425, as in the second embodiment. Thereafter, the operational amplifier 431 adjusts the bias voltage according to a difference between the integrated value temporarily held in the holding circuit 425 and the target value $V_{20}$. In addition, in the operational amplifier 453 of the constant-voltage source 405, the gate potential of each of the first transistor 451 and the second transistor 452 is adjusted according to a difference between the current flowing through the first transistor 451 and the output value of the operational amplifier 431. Note that, in the present embodiment, the LPF 423 described in the first embodiment may be provided instead of the integration circuit 424 and the holding circuit 425. In this case, the total pixel current is smoothed.

According to the present embodiment described above, the light detection performance and the light emission performance can be optimized according to a light quantity of the background light L3 as in the second embodiment. In addition, the present embodiment uses the bias power supply 405 having a current detection function as the bias power supply, whereby it is possible to measure the total pixel current with a circuit configuration in which the resistance element 421 is not disposed in a current path between the photodetection element 411 and the bias power supply.

Fourth Embodiment

Figure 8:
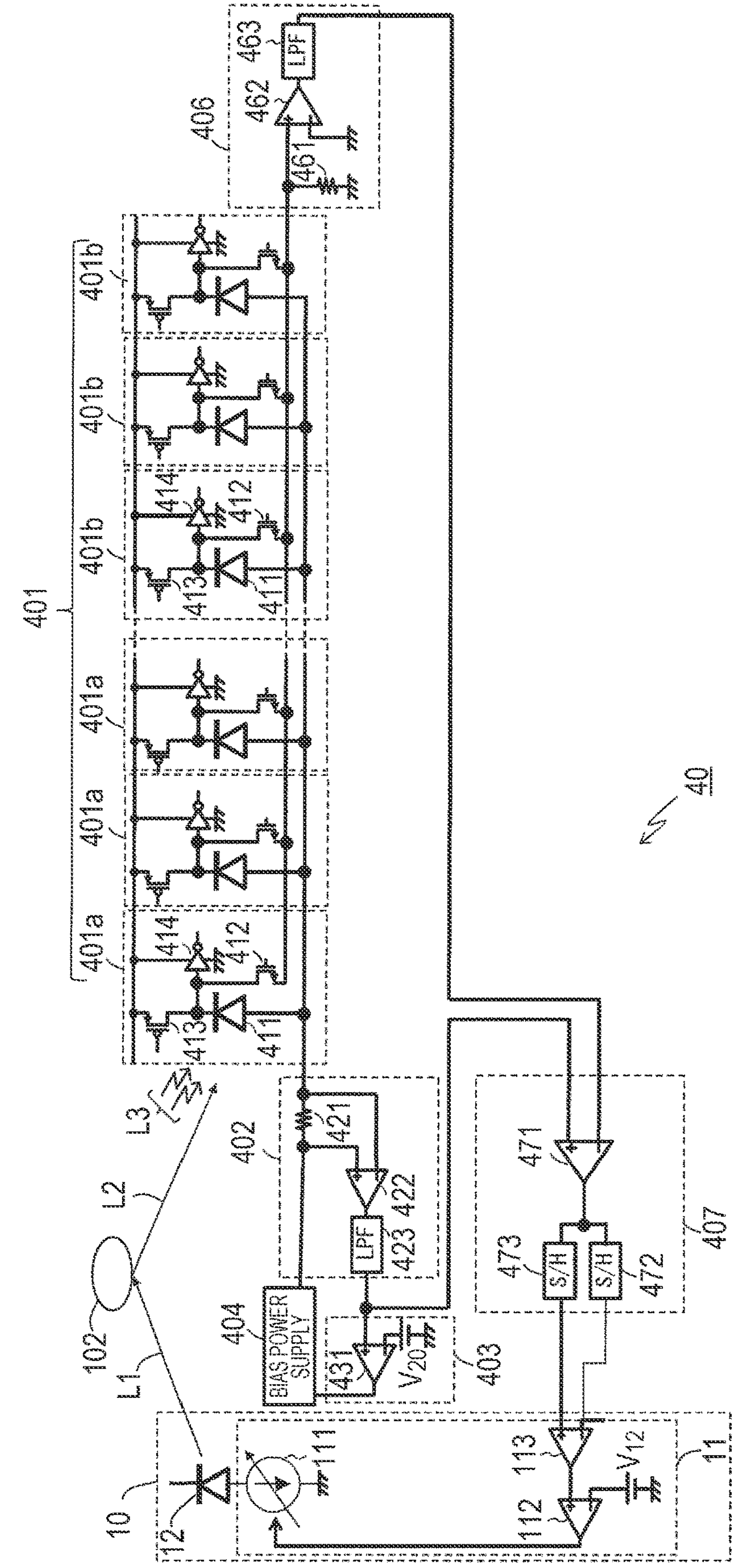
FIG. 8 is a diagram illustrating a circuit configuration of a light emitting device and a photodetection device according to a fourth embodiment.

FIG. 8 is a diagram illustrating a circuit configuration of a light emitting device 10 and a photodetection device 40 according to a fourth embodiment. Components similar to those of the first embodiment described above are denoted by the same reference numerals, and detailed description thereof will be omitted. The photodetection device 40 according to the present embodiment further includes an inactive pixel current measurement circuit 406 and an active pixel current measurement circuit 407.

The inactive pixel current measurement circuit 406 is a circuit for measuring an inactive pixel current indicating the sum of the pixel currents of the pixels 401*b* set as inactive pixels. Specifically, the inactive pixel current measurement circuit 406 includes a resistance element 461, an operational amplifier 462, and an LPF 463. One end of the resistance element 461 is connected to a current path (for example, a source of the switch element 412), and the other end is grounded.

One end of the resistance element 461 is connected to the non-inverting input terminal (+) of the operational amplifier 462, and the potential of the inverting input terminal (−) is grounded. The operational amplifier 462 outputs a voltage of the resistance element 461 to the LPF 463 as an inactive pixel current. The LPF 463 smooths the inactive pixel current. As a result, an average value of currents of the inactive pixels is obtained.

On the other hand, the active pixel current measurement circuit 407 is a circuit for measuring an active pixel current indicating the sum of the pixel currents of the pixels 401*a* set as active pixels. Specifically, the active pixel current measurement circuit 407 includes an operational amplifier 471, a first sample and hold (S/H) circuit 472, and a second sample and hold (S/H) circuit 473.

An average value of the currents of all pixels measured by the LPF 423 is input to the non-inverting input terminal (+) of the operational amplifier 471, and an average value of the currents of the inactive pixels measured by the inactive pixel current measurement circuit 406 is input to the inverting input terminal (−). The operational amplifier 471 measures the active pixel current by subtracting the average value of the currents of the inactive pixels from the average value of the currents of all pixels.

The first sample and hold circuit 472 temporarily holds a first detection value of the operational amplifier 471 before the light emitting element 12 emits the distance measurement light L1. On the other hand, the second sample and hold circuit 473 temporarily holds a second detection value of the operational amplifier 471 after the light emitting element 12 emits the distance measurement light L1. The first detection value and the second detection value are simultaneously output to the light emission control unit 11.

The light emission control unit 11 according to the present embodiment further includes an operational amplifier 113. The second detection value is input to the non-inverting input terminal (+) of the operational amplifier 113, and the first detection value is input to the inverting input terminal (−). The operational amplifier 113 outputs a difference between the second detection value and the first detection value. This difference corresponds to a reaction current of the photodetection element 411 of the pixel 401*a* with respect to the distance measurement light L1. This reaction current is input to the non-inverting input terminal (+) of the operational amplifier 112. The operational amplifier 112 adjusts the light emission current according to a difference between the reaction current and a target value $V_{12}$.

Figure 9:
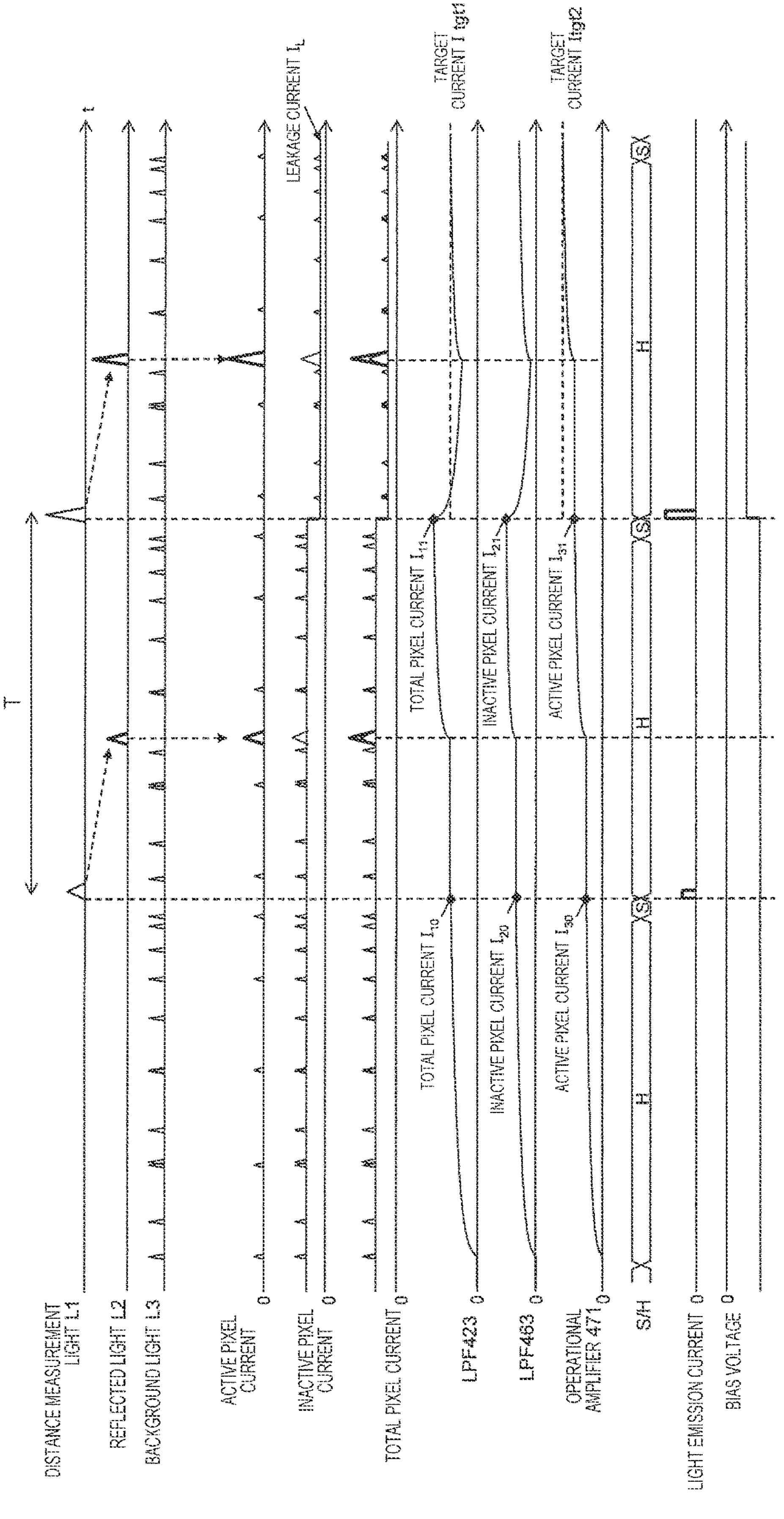
FIG. 9 is a timing chart illustrating operation timing of a distance measurement system according to the fourth embodiment.
Figure 10:
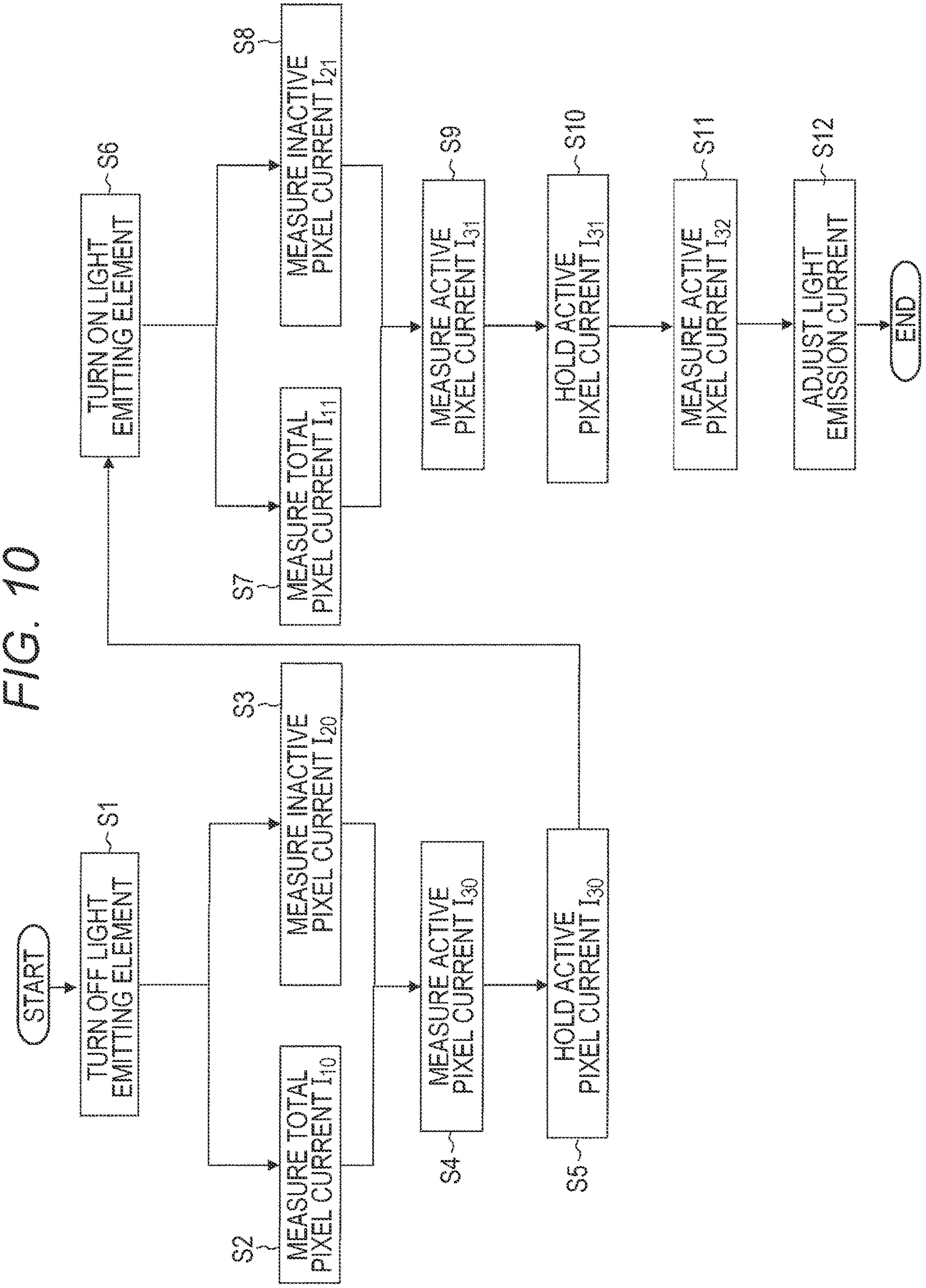
FIG. 10 is a flowchart illustrating an operation procedure of the distance measurement system according to the fourth embodiment.

FIG. 9 is a timing chart illustrating operation timing of the distance measurement system according to the present embodiment. In addition, FIG. 10 is a flowchart illustrating an operation procedure of the distance measurement system according to the present embodiment. The operation of the distance measurement system according to the present embodiment will be described below with reference to FIGS. 9 and 10.

First, the light emitting element 12 is turned off on the basis of the control of the light emission control unit 11 (step S1). In this case, the background light L3 is incident on the photodetection element 411 of each of the pixel 401*a* (active pixel) and the pixel 401*b* (inactive pixel).

Next, the current measurement circuit 402 measures a total pixel current $I_{10}$ (step S2). In parallel with step S2, the inactive pixel current measurement circuit 406 measures an inactive pixel current $I_{20}$ (step S3). The total pixel current $I_{10}$ and the inactive pixel current $I_{20}$ include only a current component of the background light L3.

Next, the active pixel current measurement circuit 407 subtracts the inactive pixel current $I_{20}$ from the total pixel current $I_{10}$ to measure an active pixel current $I_{30}$ (step S4). The active pixel current $I_{30}$ is held in the first sample and hold circuit 472 (step S5).

Next, the light emitting element 12 is turned on on the basis of the control of the light emission control unit 11 (step S6). In this case, the distance measurement light L1 is emitted from the light emitting element 12 toward the subject 102, and the reflected light L2 and the background light L3 are incident on the photodetection elements 411 of the pixel 401*a* (active pixel) and the pixel 401*b* (inactive pixel).

Next, the current measurement circuit 402 measures a total pixel current $I_{11}$ (step S7). In parallel with step S7, the inactive pixel current measurement circuit 406 measures an inactive pixel current $I_{22}$ (step S8). The total pixel current $I_{11}$ and the inactive pixel current $I_{22}$ include a current component of the reflected light L2 as well as the current component of the background light L3.

Next, the active pixel current measurement circuit 407 subtracts the inactive pixel current $I_{21}$ from the total pixel current $I_{11}$ to measure an active pixel current $I_{31}$ (step S9). The active pixel current $I_{31}$ is held in the second sample and hold circuit 472 (step S10).

Subsequently, the active pixel current $I_{30}$ and the active pixel current $I_{31}$ are simultaneously input to the light emission control unit 11. The light emission control unit 11 subtracts the active pixel current $I_{30}$ from the active pixel current $I_{31}$ to measure an active pixel current $I_{32}$ (step S11). The active pixel current $I_{32}$ includes only a current component of the reflected light L2, and thus, corresponds to a reaction current of the photodetection element 411 of the active pixel with respect to the distance measurement light L1.

Finally, the light emission control unit 11 adjusts the light emission current on the basis of the active pixel current $I_{32}$ (step S12). Furthermore, the bias voltage control unit 403 adjusts the bias voltage on the basis of the total pixel current $I_{11}$. As a result, the total pixel current and the active pixel current are controlled to be a target current $I_{tgt1}$ and a target current $I_{tgt1}$, respectively.

According to the present embodiment, the bias voltage is controlled so that the consumption current of the entire pixel array 401 becomes a predetermined current target value, and the light emission current is controlled so that the active pixel current by the reflected light L2 becomes a predetermined current target value as described above. As a result, the current component of the reflected light L3 increases due to a decrease in the current component of the background light L3 and the leakage current $I_L$, and thus, a light quantity of the distance measurement light L1 increases.

Furthermore, in the present embodiment, it is possible to detect a photon reaction of the photodetection element 411 that cannot be detected by the inverter 414 of each pixel. This effect will be described below with reference to FIG. 11.

Figure 11:
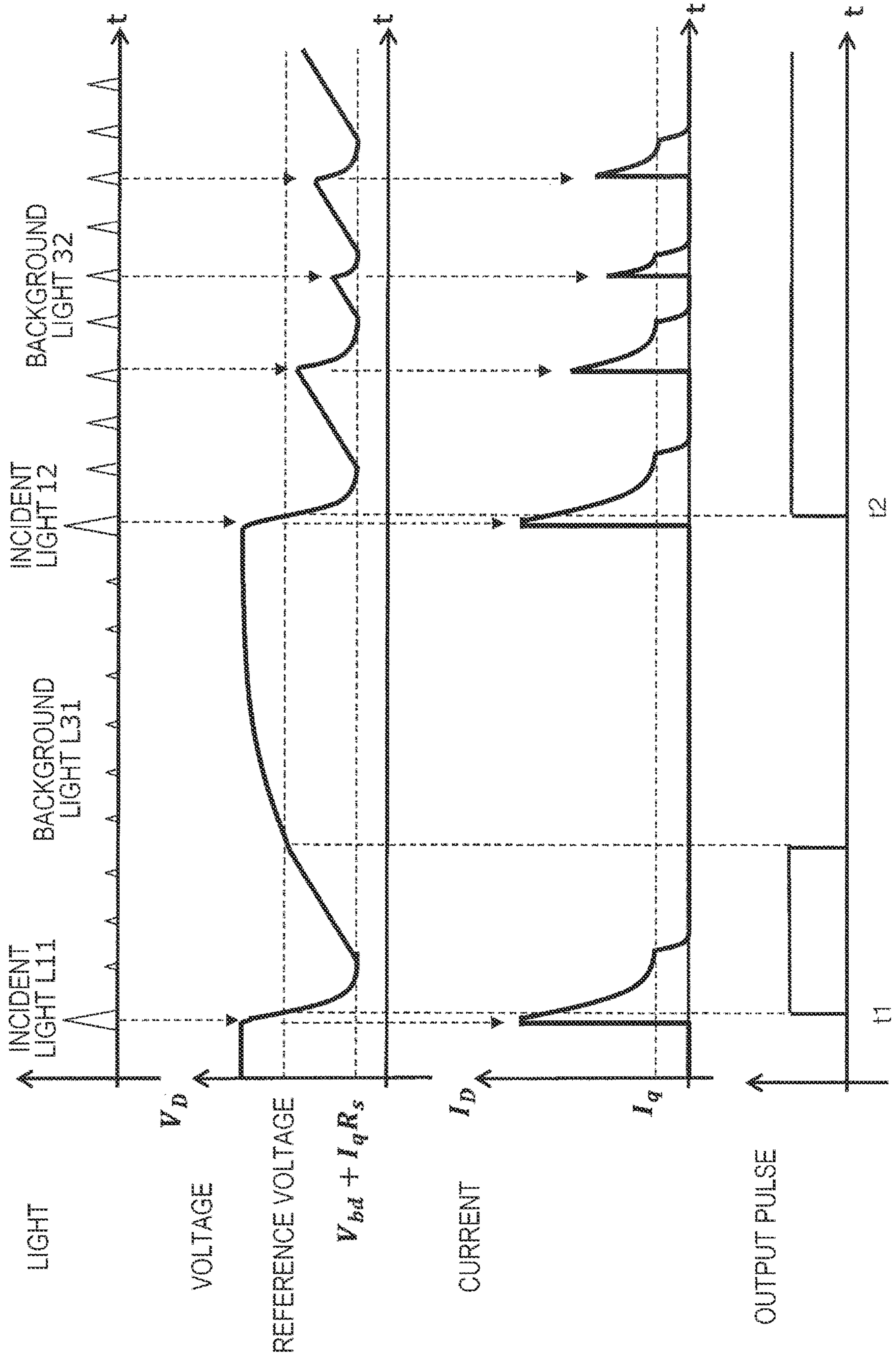
FIG. 11 is a timing chart illustrating operation timings of a photodetection element and an inverter.

FIG. 11 is a timing chart illustrating operation timings of the photodetection element 411 and the inverter 414. FIG. 11 illustrates changes in a voltage $V_D$ and a current $I_D$ between the anode and the cathode of the photodetection element 411 of the active pixel.

First, a current due to avalanche multiplication flows by a photon reaction of the photodetection element 411 with respect to incident light L11 at time t1. Therefore, the anode-cathode voltage $V_D$ decreases to a voltage obtained by adding a breakdown voltage Vbd and a voltage obtained by integrating a series parasitic resistance Rs and a current Iq. Thus, avalanche multiplication stops (the photodetection element 411 exits the Geiger mode).

Subsequently, a so-called recharge operation is performed in which the anode-cathode voltage $V_D$ is recovered due to a current flowing from the current source 413. At this time, a light quantity of background light L31 is sufficiently small, so that no photon reaction occurs during the recharge operation.

Thereafter, the current Iq due to avalanche multiplication flows by the photon reaction of the photodetection element 411 with respect to incident light L12 at time t2. Due to the photon reaction, the anode-cathode voltage $V_D$ drops again, and subsequently, the recharge operation is started. At this time, a light quantity of background light L32 is larger than that of the background light 31, and thus, a photon reaction occurs a plurality of times. Therefore, a current flows for each photon reaction.

However, in a case where the photon reaction occurs before the anode-cathode voltage $V_D$ exceeds a reference voltage of the inverter 414, the level of the output pulse of the inverter 414 does not change, so that the photon reaction cannot be detected.

On the other hand, in the present embodiment, the active pixel current including the current component of only the background light L3 can be measured. Therefore, it is possible to detect a photon reaction of the photodetection element 411 that cannot be detected by the inverter 414.

Fifth Embodiment

Figure 12:
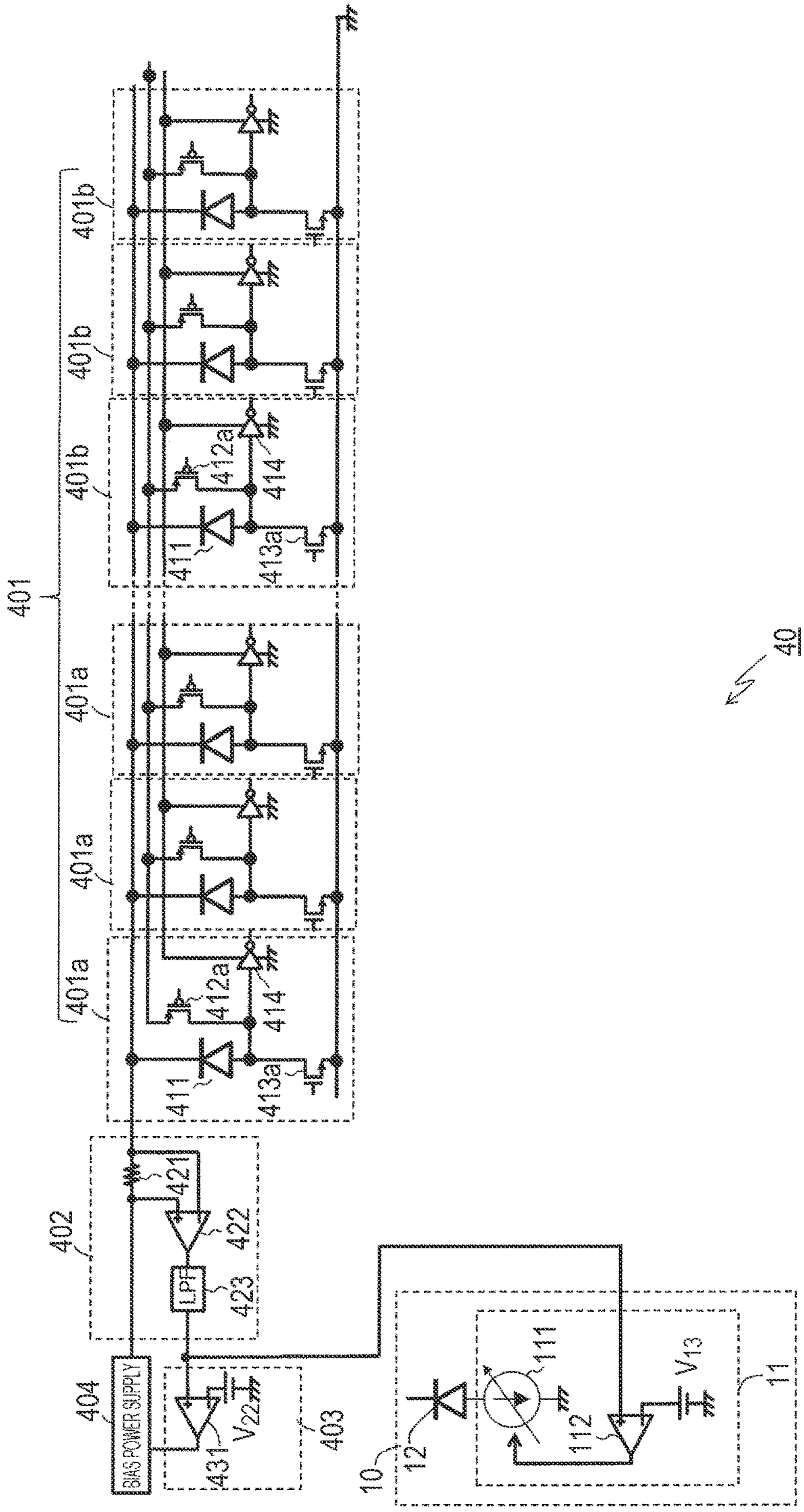
FIG. 12 is a diagram illustrating a circuit configuration of a light emitting device and a photodetection device according to a fifth embodiment.

FIG. 12 is a diagram illustrating a circuit configuration of a light emitting device 10 and a photodetection device 40 according to a fifth embodiment. Components similar to those of the first embodiment described above are denoted by the same reference numerals, and detailed description thereof will be omitted.

In a pixel array 401 of the photodetection device 40 according to the present embodiment, the anode of the photodetection element 411 is connected to the inverter 414, and the cathode is connected to the current measurement circuit 402. The inverter 414 outputs a digital signal indicating whether or not the anode voltage has changed to the signal processing circuit 50. In addition, a current source 413*a* including an N-type MOS transistor and a switch element 412*a* including a P-type MOS transistor are connected to the anode of the photodetection element 411.

The current measurement circuit 402 measures an average value of currents of all pixels on the cathode side of the photodetection element 411. Note that, in the current measurement circuit 402, the integration circuit 424 and the holding circuit 425 described in the second embodiment may be provided instead of the LPF 423.

The bias voltage control unit 403 adjusts a bias voltage to be supplied from the bias power supply 404 to the cathode of each photodetection element 411 according to a difference between the average pixel current value obtained by smoothing processing performed by the LPF 423 and a target value $V_{22}$. In addition, the operational amplifier 112 of the light emission control unit 11 adjusts the light emission current of the light emitting element 12 according to a difference between the average pixel current value and a target value $V_{13}$.

In the present embodiment described above, the bias voltage is adjusted by measuring the pixel currents of both the active pixel (401*a*) and the inactive pixel (pixel 401*b*) as in the first embodiment. Therefore, the bias voltage can be optimized according to the light quantity of the background light L3. In addition, the light emission control unit 11 adjusts the light emission current on the basis of the average pixel current value, whereby power consumption can be reduced with distance measurement performance being maintained.

Sixth Embodiment

Figure 13:
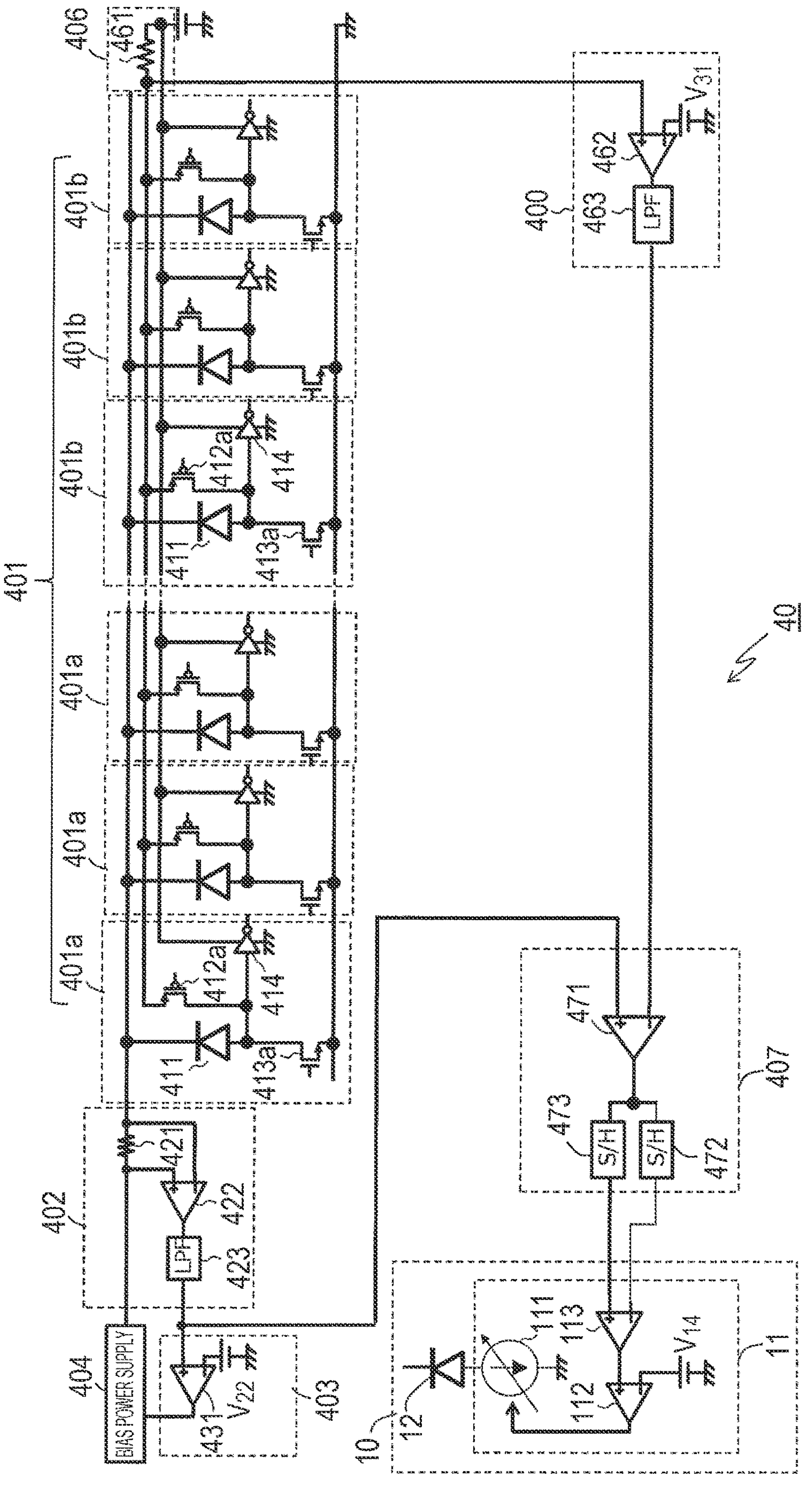
FIG. 13 is a diagram illustrating a circuit configuration of a light emitting device and a photodetection device according to a sixth embodiment.

FIG. 13 is a diagram illustrating a circuit configuration of a light emitting device 10 and a photodetection device 40 according to a sixth embodiment. Components similar to those of the fifth embodiment described above are denoted by the same reference numerals, and detailed description thereof will be omitted.

The photodetection device 40 according to the present embodiment further includes an inactive pixel current measurement circuit 406 and an active pixel current measurement circuit 407. The inactive pixel current measurement circuit 406 measures an inactive pixel current of the pixels 401*b* (inactive pixels) as in the fourth embodiment. In addition, the active pixel current measurement circuit 407 also measures an active pixel current before and after irradiation with the distance measurement light L1 as in the fourth embodiment.

Further, similar to the fourth embodiment, the light emission control unit 11 also measures a reaction current of the photodetection element 411 with respect to the distance measurement light L1, and adjusts the light emission current according to a difference between the reaction current and a target value $V_{14}$.

Therefore, in the present embodiment, it is also possible to optimize the bias voltage and reduce the power consumption with the distance measurement performance being maintained. In addition, a photon reaction of the photodetection element 411 that cannot be detected by the inverter 414 of each pixel can also be detected.

(First modification)

Figure 14:
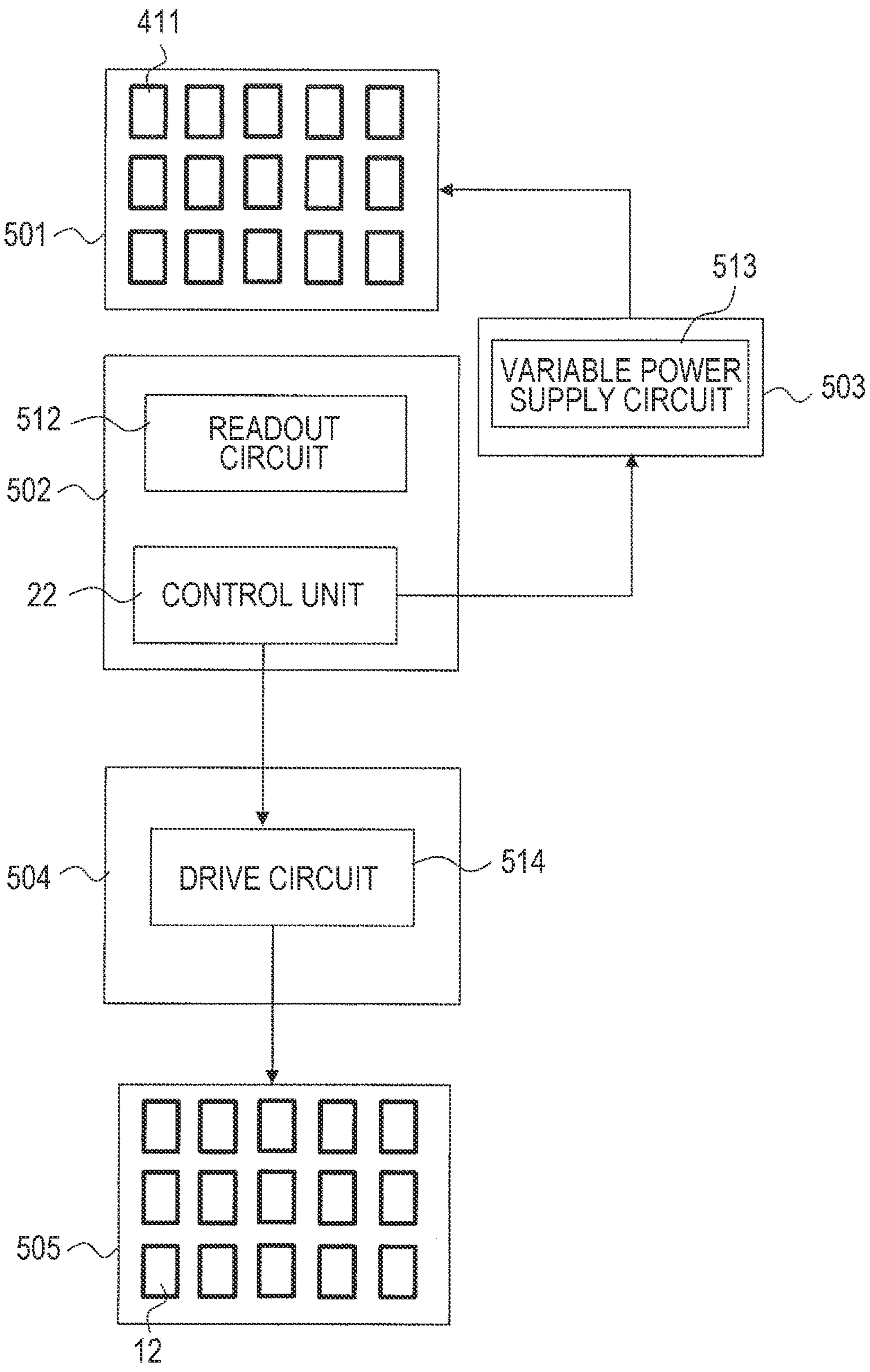
FIG. 14 is a layout diagram illustrating an example of a layout of the distance measurement system according to each of the embodiments.

FIG. 14 is a layout diagram illustrating an example of a layout of the distance measurement system according to each of the embodiments described above.

In the modification illustrated in FIG. 14, a plurality of photodetection elements 411 arranged two-dimensionally is provided on a first semiconductor substrate 501. A second semiconductor substrate 502 is bonded to the first semiconductor substrate 501 with a copper pad. Thus, the first semiconductor substrate 501 and the second semiconductor substrate 502 are formed as one semiconductor chip stacked on each other.

The second semiconductor substrate 502 is provided with a readout circuit 512 of each photodetection element 411 and a control unit 22. The readout circuit 512 includes, for example, the signal processing circuit 50 and the like in addition to components other than the photodetection elements 411 of the pixel array 401 and a part of the photodetection device 40 such as the current measurement circuit 402.

In addition, a variable power supply circuit 513 is provided on a third semiconductor substrate 503 formed as a separate chip from the first semiconductor substrate 501 and the second semiconductor substrate 502. The variable power supply circuit 513 is provided with, for example, the rest of the photodetection device 40 such as the bias voltage control unit 403 and the bias power supply 404.

Furthermore, the present modification also includes a fourth semiconductor substrate 504 and a fifth semiconductor substrate 505 formed as separate chips from the first semiconductor substrate 501 and the second semiconductor substrate 502. The fourth semiconductor substrate 504 is provided with a drive circuit 514. The drive circuit 514 is provided with, for example, components related to driving of the light emitting element 12 such as the light emission control unit 11 described above. On the other hand, a plurality of light emitting elements 12 arranged two-dimensionally is provided on the fifth semiconductor substrate 505.

According to the present modification described above, the photodetection elements 411 are disposed on one independent semiconductor substrate, whereby the ratio (fill factor) of a light receiving region to the semiconductor substrate is increased. As a result, photons incident on the photodetection elements 411 can be detected with high probability. In addition, the light emitting elements 12 are also disposed on one independent semiconductor substrate, whereby the ratio of a light emitting region to the semiconductor substrate is increased.

(Second Modification)

Figure 15:
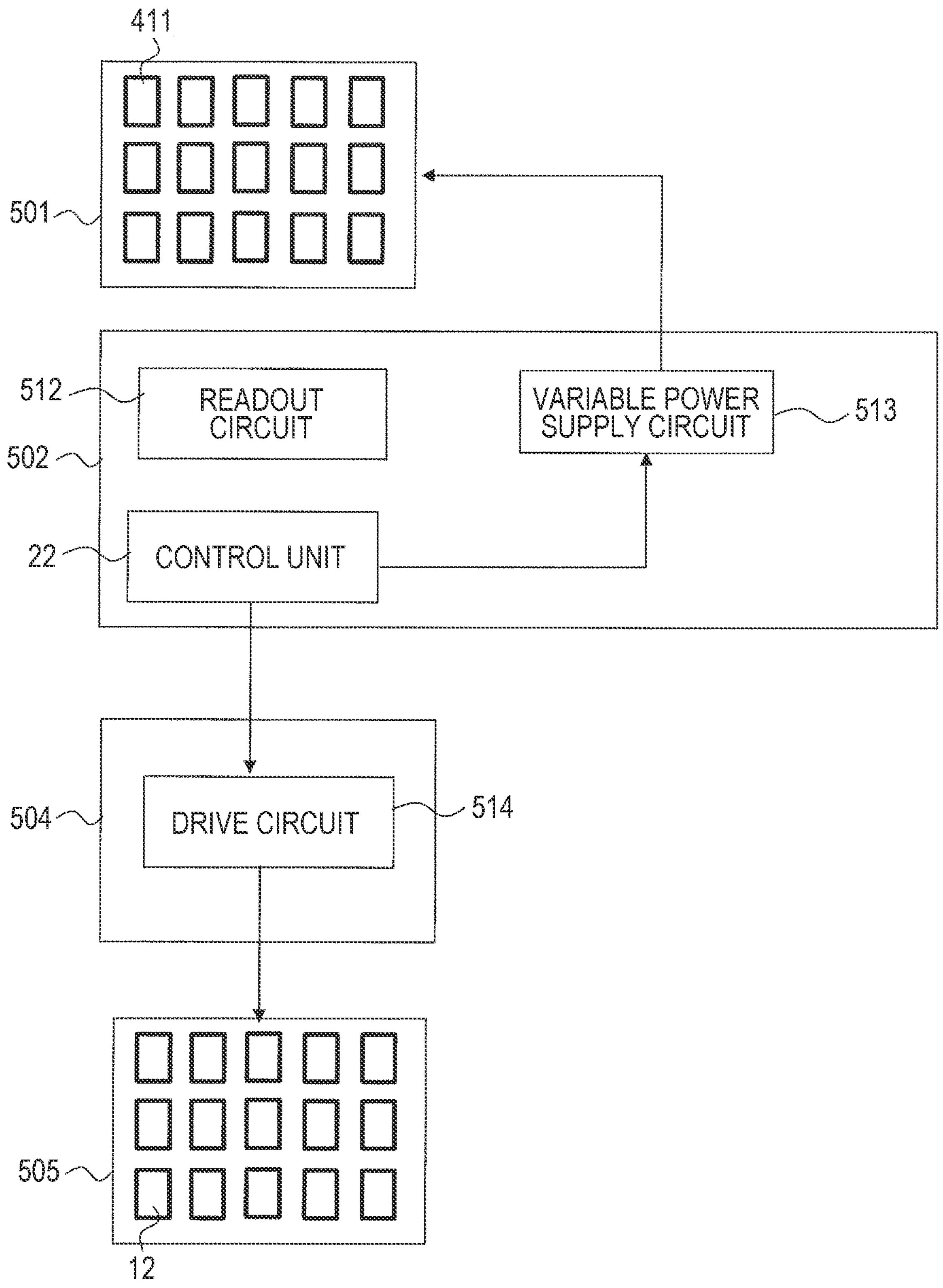
FIG. 15 is a layout diagram illustrating another example of a layout of the distance measurement system according to each of the embodiments.

FIG. 15 is a layout diagram illustrating another example of a layout of the distance measurement system according to each of the embodiments described above. Components similar to those of the first modification described above are denoted by the same reference numerals, and detailed description thereof will be omitted.

In the present modification, the variable power supply circuit 513 is provided on the second semiconductor substrate 502. That is, a whole of the photodetection device 40 is concentrated on the second semiconductor substrate 502.

Therefore, according to the present embodiment, the third semiconductor substrate 503 is unnecessary, whereby the system can be downsized.

<Example of Application to Mobile Body>

The technology according to the present disclosure (present technology) can be applied to various products. For example, the technology according to the present disclosure may be implemented as a device to be mounted on any type of mobile bodies such as vehicles, electric vehicles, hybrid electric vehicles, motorcycles, bicycles, personal mobilities, airplanes, drones, ships, and robots.

Figure 16:
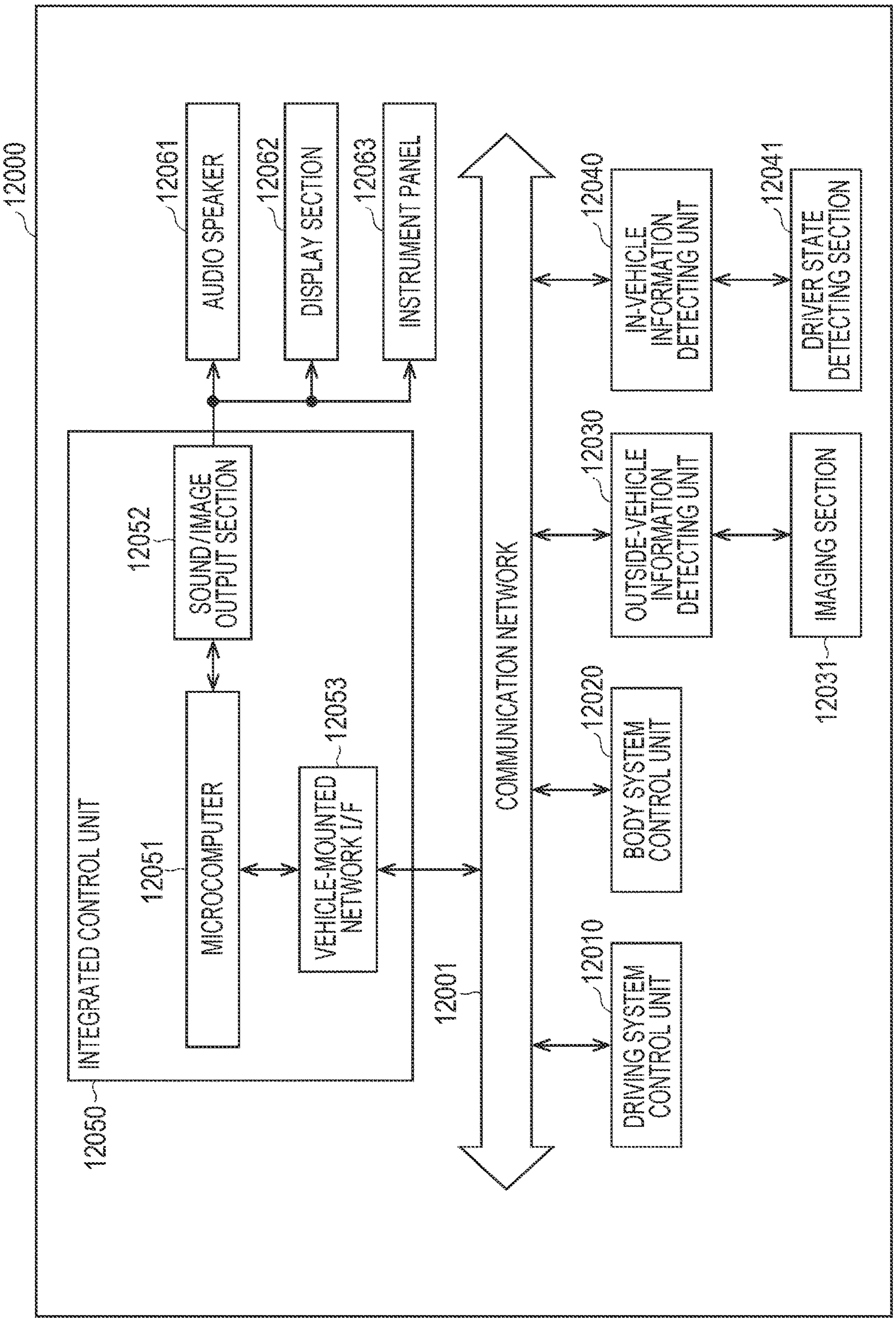
FIG. 16 is a block diagram illustrating an example of schematic configuration of a vehicle control system.

FIG. 16 is a block diagram depicting an example of schematic configuration of a vehicle control system as an example of a mobile body control system to which the technology according to the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily giving information to an occupant of the vehicle or the outside of the vehicle. In the example of FIG. 16, an audio speaker 12061, a display section 12062, and an instrument panel 12063 are illustrated as the output device. The display section 12062 may include, for example, at least one of an on-board display or a head-up display.

Figure 17:
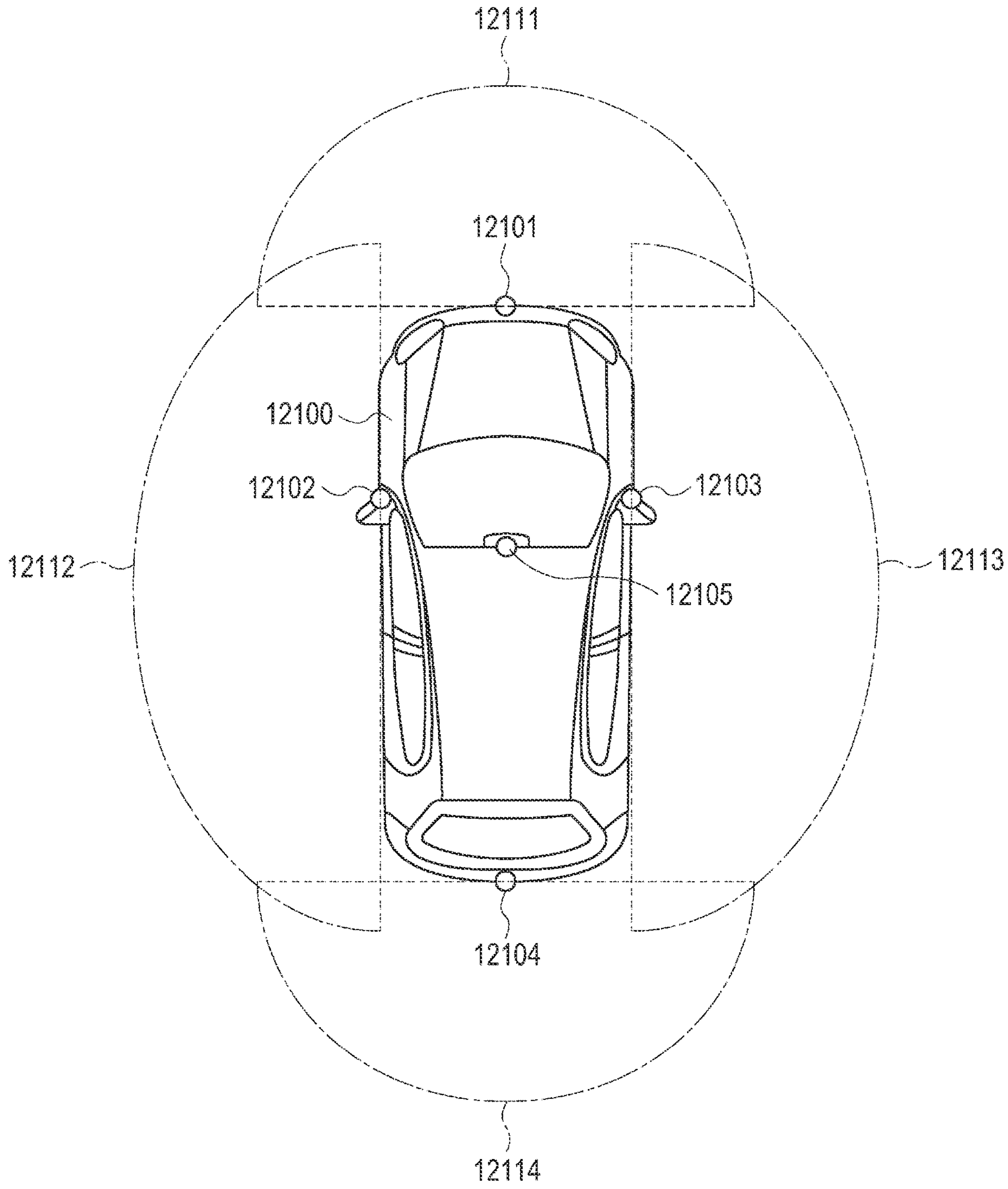
FIG. 17 is an explanatory diagram illustrating an example of installation positions of an outside-vehicle information detecting section and an imaging section.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of an environment in front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of imaging ranges of the imaging sections 12101 to 12104. An imaging range 12111 represents the imaging range of the imaging section 12101 provided to the front nose. Imaging ranges 1211212113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to, for example, the imaging section 12031 and the like in the configuration described above. Specifically, the imaging section 21 can be applied to the imaging section 12031. By applying the technology according to the present disclosure, a captured image with higher distance measurement accuracy can be obtained, whereby safety can be improved.

It is to be noted that the present technology may also have the following configurations.

(1) A distance measurement system including:

a light emitting device that emits distance measurement light; and a photodetection device that receives reflected light of the distance measurement light, in which the photodetection device includes a pixel array in which a plurality of pixels is arrayed, the plurality of pixels respectively including a plurality of avalanche photodiodes that detects the reflected light, a current measurement circuit that measures a total pixel current of the pixel array, and a bias voltage control unit that controls a bias voltage to be supplied to the plurality of avalanche photodiodes using a detection result of the current measurement circuit, and the light emitting device includes a light emission control unit that controls a light quantity of the distance measurement light using the detection result of the current measurement circuit.

(2) The distance measurement system according (1), in which the current measurement circuit includes:

a resistance element connected in series to the plurality of avalanche photodiodes;

a first operational amplifier that outputs a voltage of the resistance element; and a low-pass filter that smooths an output value of the first operational amplifier, the bias voltage control unit includes a second operational amplifier that adjusts the bias voltage according to a difference between an average pixel current value obtained by smoothing by the low-pass filter and a preset first target value, and the light emission control unit includes a third operational amplifier that adjusts the light quantity according to a difference between the average pixel current value and a preset second target value.

(3) The distance measurement system according to (1), in which the current measurement circuit includes:

a resistance element connected in series to the plurality of avalanche photodiodes;

a first operational amplifier that outputs a voltage of the resistance element;

an integration circuit that integrates an output value of the first operational amplifier; and a holding circuit that temporarily holds an integrated value of the integration circuit, the bias voltage control unit includes a second operational amplifier that adjusts the bias voltage according to a difference between a held value held by the holding circuit and a preset first target voltage, and the light emission control unit includes a third operational amplifier that adjusts the light quantity according to a difference between the held value and a preset second target value.

(4) The distance measurement system according (1), in which the photodetection device further includes a constant-voltage source connected to the plurality of avalanche photodiodes, the current measurement circuit includes a resistance element connected to the plurality of avalanche photodiodes via the constant-voltage source, and a first operational amplifier that outputs a voltage of the resistance element, the bias voltage control unit includes an integration circuit that integrates an output value of the first operational amplifier, a holding circuit that temporarily holds an integrated value of the integration circuit, and a second operational amplifier that adjusts the bias voltage and the constant-voltage source according to a difference between the held value held by the holding circuit and a preset first target voltage, and the light emission control unit includes a third operational amplifier that adjusts the light quantity according to a difference between the held value and a preset second target value.

(5) The distance measurement system according to (4), in which the constant-voltage source includes:

a current mirror circuit including a first transistor connected in series to the plurality of avalanche photodiodes and a second transistor connected in series to the resistance element; and a fourth operational amplifier that controls the first transistor and the second transistor according to a difference between the total pixel current and an output value of the second operational amplifier.

(6) The distance measurement system according to (1), in which the photodetection device further includes:

a plurality of switch elements that switches the plurality of pixels to active pixels or inactive pixels;

an inactive pixel current measurement circuit that measures an inactive pixel current indicating a sum of pixel currents of the inactive pixels; and an active pixel current measurement circuit that measures an active pixel current indicating a sum of pixel currents of the active pixels by subtracting a detection value of the inactive pixel current measurement circuit from a detection value of the current measurement circuit.

(7) The distance measurement system according to (6), in which the active pixel current measurement circuit includes a first sample and hold circuit that temporarily holds a first detection value detected by the active pixel current measurement circuit before the distance measurement light is emitted, and a second sample and hold circuit that temporarily holds a second detection value detected by the active pixel current measurement circuit after the distance measurement light is emitted, and the light emission control unit includes a first operational amplifier that outputs a difference between the first detection value and the second detection value, and a second operational amplifier that adjusts the light quantity according to a difference between an output value of the first operational amplifier and a preset target value.

(8) The distance measurement system according to (1), in which the plurality of avalanche photodiodes is provided on a first semiconductor substrate, and a part of the photodetection device excluding the plurality of avalanche photodiodes is provided on a second semiconductor substrate to be bonded to the first semiconductor substrate.

(9) The distance measurement system according to (1), in which the plurality of avalanche photodiodes is provided on a first semiconductor substrate, and a whole of the photodetection device excluding the plurality of avalanche photodiodes is provided on a second semiconductor substrate to be bonded to the first semiconductor substrate.

(10) The distance measurement system according to (1), in which the current measurement circuit is connected to an anode of each of the plurality of avalanche photodiodes.

(11) The distance measurement system according to (1), in which the current measurement circuit is connected to a cathode of each of the plurality of avalanche photodiodes.

(12) A photodetection device including:

a pixel array in which a plurality of pixels is arrayed, the plurality of pixels respectively including a plurality of avalanche photodiodes that detects reflected light of distance measurement light;

a current measurement circuit that measures a total pixel current of the pixel array; and a bias voltage control unit that controls a bias voltage to be supplied to the plurality of avalanche photodiodes using a detection result of the current measurement circuit.

(13) The photodetection device according to (12), in which the current measurement circuit includes:

a resistance element connected in series to the plurality of avalanche photodiodes;

a first operational amplifier that outputs a voltage of the resistance element; and a low-pass filter that smooths an output value of the first operational amplifier, and the bias voltage control unit includes a second operational amplifier that adjusts the bias voltage according to a difference between an average pixel current value obtained by smoothing by the low-pass filter and a preset first target value.

(14) The photodetection device according to (12), in which the current measurement circuit includes:

a resistance element connected in series to the plurality of avalanche photodiodes;

a first operational amplifier that outputs a voltage of the resistance element;

an integration circuit that integrates an output value of the first operational amplifier; and a holding circuit that temporarily holds an integrated value of the integration circuit, and the bias voltage control unit includes a second operational amplifier that adjusts the bias voltage according to a difference between a held value held by the holding circuit and a preset first target voltage.

(15) The photodetection device according to (12), further including a constant-voltage source connected to the plurality of avalanche photodiodes, in which the current measurement circuit includes a resistance element connected to the plurality of avalanche photodiodes via the constant-voltage source, and a first operational amplifier that outputs a voltage of the resistance element, and the bias voltage control unit includes an integration circuit that integrates an output value of the first operational amplifier, a holding circuit that temporarily holds an integrated value of the integration circuit, and a second operational amplifier that adjusts the bias voltage and the constant-voltage source according to a difference between a held value held by the holding circuit and a preset first target voltage.

(16) The photodetection device according to (15), in which the constant-voltage source includes:

a current mirror circuit including a first transistor connected in series to the plurality of avalanche photodiodes and a second transistor connected in series to the resistance element; and a third operational amplifier that controls the first transistor and the second transistor according to a difference between the total pixel current and an output value of the second operational amplifier.

(17) The photodetection device according to (12), further including:

a plurality of switch elements that switches the plurality of pixels to active pixels or inactive pixels;

an inactive pixel current measurement circuit that measures an inactive pixel current indicating a sum of pixel currents of the inactive pixels; and an active pixel current measurement circuit that measures an active pixel current indicating a sum of pixel currents of the active pixels by subtracting a detection value of the inactive pixel current measurement circuit from a detection value of the current measurement circuit.

(18) The photodetection device according to (17), in which the active pixel current measurement circuit includes a first sample and hold circuit that temporarily holds a first detection value detected by the active pixel current measurement circuit before the distance measurement light is emitted, and a second sample and hold circuit that temporarily holds a second detection value detected by the active pixel current measurement circuit after the distance measurement light is emitted.

(19) The photodetection device according to (12), in which the plurality of avalanche photodiodes is provided on a first semiconductor substrate, and a part of the photodetection device excluding the plurality of avalanche photodiodes is provided on a second semiconductor substrate to be bonded to the first semiconductor substrate.

(20) The photodetection device according to (12), in which the plurality of avalanche photodiodes is provided on a first semiconductor substrate, and a whole of the photodetection device excluding the plurality of avalanche photodiodes is provided on a second semiconductor substrate to be bonded to the first semiconductor substrate.

REFERENCE SIGNS LIST

10 Light emitting device
11 Light emission control unit
40 Photodetection device
112 Operational amplifier
113 Operational amplifier
401 Pixel array
402 Current measurement circuit
403 Bias voltage control unit
405 Bias power supply having current detection function
406 Inactive pixel current measurement circuit
407 Active pixel current measurement circuit
412, 412*a* Switch element
421 Resistance element
422 Operational amplifier
423 LPF
424 Integration circuit
425 Holding circuit
431 Operational amplifier
451 First transistor
452 Second transistor
453 Operational amplifier
472 First sample and hold circuit
473 Second sample and hold circuit

The invention claimed is:

1. A distance measurement system comprising:

a light emitting device that emits distance measurement light; and a photodetection device that receives reflected light of the distance measurement light, wherein the photodetection device includes a pixel array in which a plurality of pixels is arrayed, the plurality of pixels respectively including a plurality of avalanche photodiodes that detects the reflected light, a current measurement circuit that measures a total pixel current of the pixel array, and a bias voltage control circuit that controls a bias voltage to be supplied to the plurality of avalanche photodiodes using a detection result of the current measurement circuit, and the light emitting device includes a light emission control circuit that controls a light quantity of the distance measurement light using the detection result of the current measurement circuit; and wherein the current measurement circuit includes:

a resistance element connected in series to the plurality of avalanche photodiodes;

a first operational amplifier that outputs a voltage of the resistance element; and a low-pass filter that smooths an output value of the first operational amplifier, the bias voltage control circuit includes a second operational amplifier that adjusts the bias voltage according to a difference between an average pixel current value obtained by smoothing by the low-pass filter and a preset first target value, and the light emission control circuit includes a third operational amplifier that adjusts the light quantity according to a difference between the average pixel current value and a preset second target value.

2. A distance measurement system comprising:

a light emitting device that emits distance measurement light;

a photodetection device that receives reflected light of the distance measurement light, wherein the photodetection device includes a pixel array in which a plurality of pixels is arrayed, the plurality of pixels respectively including a plurality of avalanche photodiodes that detects the reflected light, a current measurement circuit that measures a total pixel current of the pixel array, and a bias voltage control circuit that controls a bias voltage to be supplied to the plurality of avalanche photodiodes using a detection result of the current measurement circuit, and the light emitting device includes a light emission control circuit that controls a light quantity of the distance measurement light using the detection result of the current measurement circuit; and wherein the current measurement circuit includes:

a resistance element connected in series to the plurality of avalanche photodiodes;

a first operational amplifier that outputs a voltage of the resistance element;

an integration circuit that integrates an output value of the first operational amplifier; and a holding circuit that temporarily holds an integrated value of the integration circuit, the bias voltage control circuit includes a second operational amplifier that adjusts the bias voltage according to a difference between a held value held by the holding circuit and a preset first target voltage, and the light emission control circuit includes a third operational amplifier that adjusts the light quantity according to a difference between the held value and a preset second target value.

3. A distance measurement system comprising:

a light emitting device that emits distance measurement light;

a photodetection device that receives reflected light of the distance measurement light, wherein the photodetection device includes a pixel array in which a plurality of pixels is arrayed, the plurality of pixels respectively including a plurality of avalanche photodiodes that detects the reflected light, a current measurement circuit that measures a total pixel current of the pixel array, and a bias voltage control circuit that controls a bias voltage to be supplied to the plurality of avalanche photodiodes using a detection result of the current measurement circuit, and the light emitting device includes a light emission control circuit that controls a light quantity of the distance measurement light using the detection result of the current measurement circuit; and wherein the photodetection device further includes a constant-voltage source connected to the plurality of avalanche photodiodes, the current measurement circuit includes a resistance element connected to the plurality of avalanche photodiodes via the constant-voltage source, and a first operational amplifier that outputs a voltage of the resistance element, the bias voltage control circuit includes an integration circuit that integrates an output value of the first operational amplifier, a holding circuit that temporarily holds an integrated value of the integration circuit as a held value, and a second operational amplifier that adjusts the bias voltage and the constant-voltage source according to a difference between the held value held by the holding circuit and a preset first target voltage, and the light emission control circuit includes a third operational amplifier that adjusts the light quantity according to a difference between the held value and a preset second target value.

4. The distance measurement system according to claim 3, wherein the constant-voltage source includes:

a current mirror circuit including a first transistor connected in series to the plurality of avalanche photodiodes and a second transistor connected in series to the resistance element; and a fourth operational amplifier that controls the first transistor and the second transistor according to a difference between the total pixel current and an output value of the second operational amplifier.

5. A distance measurement system comprising:

a light emitting device that emits distance measurement light;

a photodetection device that receives reflected light of the distance measurement light, wherein the photodetection device includes a pixel array in which a plurality of pixels is arrayed, the plurality of pixels respectively including a plurality of avalanche photodiodes that detects the reflected light, a current measurement circuit that measures a total pixel current of the pixel array, and a bias voltage control circuit that controls a bias voltage to be supplied to the plurality of avalanche photodiodes using a detection result of the current measurement circuit, and the light emitting device includes a light emission control circuit that controls a light quantity of the distance measurement light using the detection result of the current measurement circuit; and wherein the photodetection device further includes:

a plurality of switch elements that switches the plurality of pixels to active pixels or inactive pixels;

an inactive pixel current measurement circuit that measures an inactive pixel current indicating a sum of pixel currents of the inactive pixels; and an active pixel current measurement circuit that measures an active pixel current indicating a sum of pixel currents of the active pixels by subtracting a detection value of the inactive pixel current measurement circuit from a detection value of the current measurement circuit.

6. The distance measurement system according to claim 5, wherein the active pixel current measurement circuit includes a first sample and hold circuit that temporarily holds a first detection value detected by the active pixel current measurement circuit before the distance measurement light is emitted, and a second sample and hold circuit that temporarily holds a second detection value detected by the active pixel current measurement circuit after the distance measurement light is emitted, and the light emission control circuit includes a first operational amplifier that outputs a difference between the first detection value and the second detection value, and a second operational amplifier that adjusts the light quantity according to a difference between an output value of the first operational amplifier and a preset target value.

7. The distance measurement system according to claim 1, wherein the plurality of avalanche photodiodes is provided on a first semiconductor substrate, and a part of the photodetection device excluding the plurality of avalanche photodiodes is provided on a second semiconductor substrate to be bonded to the first semiconductor substrate.

8. The distance measurement system according to claim 1, wherein the plurality of avalanche photodiodes is provided on a first semiconductor substrate, and a whole of the photodetection device excluding the plurality of avalanche photodiodes is provided on a second semiconductor substrate to be bonded to the first semiconductor substrate.

9. The distance measurement system according to claim 1, wherein the current measurement circuit is connected to an anode of each of the plurality of avalanche photodiodes.

10. A distance measurement system comprising:

a light emitting device that emits distance measurement light; and a photodetection device that receives reflected light of the distance measurement light, wherein the photodetection device includes a pixel array in which a plurality of pixels is arrayed, the plurality of pixels respectively including a plurality of avalanche photodiodes that detects the reflected light, a current measurement circuit that measures a total pixel current of the pixel array, and a bias voltage control circuit that controls a bias voltage to be supplied to the plurality of avalanche photodiodes using a detection result of the current measurement circuit, the light emitting device includes a light emission control circuit that controls a light quantity of the distance measurement light using the detection result of the current measurement circuit, and the current measurement circuit is connected to a cathode of each of the plurality of avalanche photodiodes.

11. A photodetection device comprising:

a pixel array in which a plurality of pixels is arrayed, the plurality of pixels respectively including a plurality of avalanche photodiodes that detects reflected light of distance measurement light;

a current measurement circuit that measures a total pixel current of the pixel array; and a bias voltage control circuit that controls a bias voltage to be supplied to the plurality of avalanche photodiodes using a detection result of the current measurement circuit, wherein the current measurement circuit includes:

a resistance element connected in series to the plurality of avalanche photodiodes;

a first operational amplifier that outputs a voltage of the resistance element; and a low-pass filter that smooths an output value of the first operational amplifier, and the bias voltage control circuit includes a second operational amplifier that adjusts the bias voltage according to a difference between an average pixel current value obtained by smoothing by the low-pass filter and a preset first target value.

12. A photodetection device comprising:

a pixel array in which a plurality of pixels is arrayed, the plurality of pixels respectively including a plurality of avalanche photodiodes that detects reflected light of distance measurement light;

a current measurement circuit that measures a total pixel current of the pixel array; and a bias voltage control circuit that controls a bias voltage to be supplied to the plurality of avalanche photodiodes using a detection result of the current measurement circuit, wherein the current measurement circuit includes:

a resistance element connected in series to the plurality of avalanche photodiodes;

a first operational amplifier that outputs a voltage of the resistance element;

an integration circuit that integrates an output value of the first operational amplifier; and a holding circuit that temporarily holds an integrated value of the integration circuit, and the bias voltage control circuit includes a second operational amplifier that adjusts the bias voltage according to a difference between a held value held by the holding circuit and a preset first target voltage.

13. A photodetection device comprising:

a pixel array in which a plurality of pixels is arrayed, the plurality of pixels respectively including a plurality of avalanche photodiodes that detects reflected light of distance measurement light;

a current measurement circuit that measures a total pixel current of the pixel array;

a bias voltage control circuit that controls a bias voltage to be supplied to the plurality of avalanche photodiodes using a detection result of the current measurement circuit; and a constant-voltage source connected to the plurality of avalanche photodiodes, wherein the current measurement circuit includes a resistance element connected to the plurality of avalanche photodiodes via the constant-voltage source, and a first operational amplifier that outputs a voltage of the resistance element, and the bias voltage control circuit includes an integration circuit that integrates an output value of the first operational amplifier, a holding circuit that temporarily holds an integrated value of the integration circuit, and a second operational amplifier that adjusts the bias voltage and the constant-voltage source according to a difference between a held value held by the holding circuit and a preset first target voltage.

14. The photodetection device according to claim 13, wherein the constant-voltage source includes:

a current mirror circuit including a first transistor connected in series to the plurality of avalanche photodiodes and a second transistor connected in series to the resistance element; and a third operational amplifier that controls the first transistor and the second transistor according to a difference between the total pixel current and an output value of the second operational amplifier.

15. A photodetection device comprising:

a pixel array in which a plurality of pixels is arrayed, the plurality of pixels respectively including a plurality of avalanche photodiodes that detects reflected light of distance measurement light;

a current measurement circuit that measures a total pixel current of the pixel array;

a bias voltage control circuit that controls a bias voltage to be supplied to the plurality of avalanche photodiodes using a detection result of the current measurement circuit;

a plurality of switch elements that switches the plurality of pixels to active pixels or inactive pixels;

an inactive pixel current measurement circuit that measures an inactive pixel current indicating a sum of pixel currents of the inactive pixels; and an active pixel current measurement circuit that measures an active pixel current indicating a sum of pixel currents of the active pixels by subtracting a detection value of the inactive pixel current measurement circuit from a detection value of the current measurement circuit.

16. The photodetection device according to claim 15, wherein the active pixel current measurement circuit includes a first sample and hold circuit that temporarily holds a first detection value detected by the active pixel current measurement circuit before the distance measurement light is emitted, and a second sample and hold circuit that temporarily holds a second detection value detected by the active pixel current measurement circuit after the distance measurement light is emitted.

17. The photodetection device according to claim 11, wherein the plurality of avalanche photodiodes is provided on a first semiconductor substrate, and a part of the photodetection device excluding the plurality of avalanche photodiodes is provided on a second semiconductor substrate to be bonded to the first semiconductor substrate.

18. The photodetection device according to claim 11, wherein the plurality of avalanche photodiodes is provided on a first semiconductor substrate, and a whole of the photodetection device excluding the plurality of avalanche photodiodes is provided on a second semiconductor substrate to be bonded to the first semiconductor substrate.

* * * * *